US011335686B2

(12) United States Patent
Gomes et al.

(10) Patent No.: US 11,335,686 B2
(45) Date of Patent: May 17, 2022

(54) TRANSISTORS WITH BACK-SIDE CONTACTS TO CREATE THREE DIMENSIONAL MEMORY AND LOGIC

(71) Applicant: Intel Corporation, Santa Clara, CA (US)

(72) Inventors: Wilfred Gomes, Portland, OR (US); Mauro J. Kobrinsky, Portland, OR (US); Abhishek A. Sharma, Hillsboro, OR (US); Tahir Ghani, Portland, OR (US); Doug Ingerly, Portland, OR (US); Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/669,599

(22) Filed: Oct. 31, 2019

(65) Prior Publication Data

US 2021/0134802 A1 May 6, 2021

(51) Int. Cl.
*H01L 27/108* (2006.01)

(52) U.S. Cl.
CPC .. *H01L 27/10805* (2013.01); *H01L 27/10867* (2013.01)

(58) Field of Classification Search
None
See application file for complete search history.

(56) References Cited

U.S. PATENT DOCUMENTS

| 7,092,288 | B2 | 8/2006 | Lojek |
| 7,701,751 | B2 | 4/2010 | Kang et al. |
| 7,804,702 | B2 | 9/2010 | Madan |
| 8,178,862 | B2 | 5/2012 | Colinge |
| 2002/0036313 | A1* | 3/2002 | Yang ...................... H01L 28/55 257/306 |
| 2006/0084204 | A1* | 4/2006 | Yin ......................... H01L 21/84 438/149 |

(Continued)

FOREIGN PATENT DOCUMENTS

| CN | 113345900 A | 9/2021 |
| EP | 3534401 A2 | 9/2019 |
| WO | 2018208719 A1 | 11/2018 |

OTHER PUBLICATIONS

Anil, D.G., et al., "Performance Evaluation of Ternary Computation in SRAM Design Using Graphene Nanoribbon Field Effect Transistors," IEEE 8th Annual Computing and Communication Workshop and Conference (CCWC), Las Vegas, NV, pp. 382-388 (2018).

(Continued)

*Primary Examiner* — Anthony Ho
*Assistant Examiner* — Kevin Quinto
(74) *Attorney, Agent, or Firm* — Patent Capital Group

(57) ABSTRACT

Described herein are IC devices that include transistors with contacts to one of the source/drain (S/D) regions being on the front side of the transistors and contacts to the other one of the S/D regions being on the back side of the transistors (i.e., "back-side contacts"). Using transistors with one front-side and one back-side S/D contacts provides advantages and enables unique architectures that were not possible with conventional front-end-of-line transistors with both S/D contacts being on one side.

20 Claims, 14 Drawing Sheets

(56) References Cited

U.S. PATENT DOCUMENTS

| | | | |
|---|---|---|---|
| 2009/0303801 A1* | 12/2009 | Kim | G11C 13/025 365/189.05 |
| 2010/0295102 A1 | 11/2010 | Sankin et al. | |
| 2012/0273747 A1 | 11/2012 | Saitoh et al. | |
| 2015/0035568 A1* | 2/2015 | Peng | H01L 27/0251 327/109 |
| 2015/0162336 A1* | 6/2015 | Kim | H01L 27/10858 257/301 |
| 2016/0197069 A1 | 7/2016 | Morrow et al. | |
| 2017/0256480 A1 | 9/2017 | Reingruber et al. | |
| 2017/0287905 A1 | 10/2017 | Morrow et al. | |
| 2018/0323199 A1 | 11/2018 | Roberts et al. | |
| 2019/0103406 A1 | 4/2019 | Tang et al. | |
| 2019/0287908 A1 | 9/2019 | Dogiamis et al. | |
| 2019/0305135 A1 | 10/2019 | Radosavljevic et al. | |
| 2019/0326296 A1 | 10/2019 | Wang et al. | |
| 2020/0105719 A1 | 4/2020 | Li et al. | |
| 2020/0111918 A1 | 4/2020 | Karda et al. | |
| 2020/0127142 A1 | 4/2020 | Dewey et al. | |
| 2020/0273751 A1 | 8/2020 | Dasgupta et al. | |
| 2020/0411078 A1 | 12/2020 | Sharma et al. | |
| 2020/0411524 A1 | 12/2020 | Arslan et al. | |
| 2021/0036144 A1 | 2/2021 | Liaw | |
| 2021/0098062 A1 | 4/2021 | Kwon | |
| 2021/0125990 A1 | 4/2021 | Gomes et al. | |
| 2021/0210601 A1 | 7/2021 | Pidin | |
| 2021/0272624 A1 | 9/2021 | Gomes et al. | |

OTHER PUBLICATIONS

Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.

Joshi, S., et al., "Graphene Nanoribbon Field Effect Transistor Based Ultra-Low Energy SRAM Design," IEEE International Symposium on Nanoelectronic and Information Systems (iNIS), Gwalior, pp. 76-79 (2016).

Khasanvis, S., et al., "Low-Power Heterogeneous Graphene Nanoribbon-CMOS Multistate Volatile Memory Circuit," 17 pages.

Rabieefar, et al., "Utilizing Graphene Nano-Ribbon Transistor in Data Converters: A Comparative Study," ECS Journal of Solid State Science and Technology, 8; M30-M37 (2019).

Trombini, H., et al., "Unraveling structural and compositional information in 3D FinFET electronic devices," Nature.com/ Scientific Reports; 7 pages (Aug. 12, 2019).

Xu, C., et al., "Modeling, Analysis, and Design of Graphene Nano-Ribbon Interconnects," IEEE Transaction on Electron Devices; vol. 56, No. 8; pp. 1567-1578 (Aug. 2009).

Extended European Search Report from European Application No. 20191821.6 dated Feb. 2, 2021, 9 pages.

Non Final Office Action of U.S. Appl. No. 16/806,283 dated Jan. 7, 2021, 7 pages.

Notice of Allowance in U.S. Appl. No. 16/724,691 dated Jan. 13, 2021, 9 pages.

Partial European Search Report from European Application No. 20181563.6 dated Jan. 21, 2021, 13 pages.

Barroso, Luiz A., "Impact of Chip-Level Integration on Performance of OLTP Workloads," Sixth International Symposium on High-Performance Computer Architecture (HPCA), Jan. 2000, 12 pages.

Fujun B. et al., "A Stacked Embedded DRAM Array for LPDDR4/4X using Hybrid Bonding 3D Integration with 34GB/s/1GB 0.88 pJ/b Logic-to-Memory Interface," 2020 IEEE International Electron Devices Meeting (IEDM) Dec. 12, 2020 (pp. 6-6); 4 pages.

Sinha, Saurabh, et al., "Stack up your chips: Betting on 3D integration to augment Moores Law scaling," IEEE Smart City Summit (SCS) Conference, Nov. 1, 2019, San Jose, CA; 5 pages.

\* cited by examiner

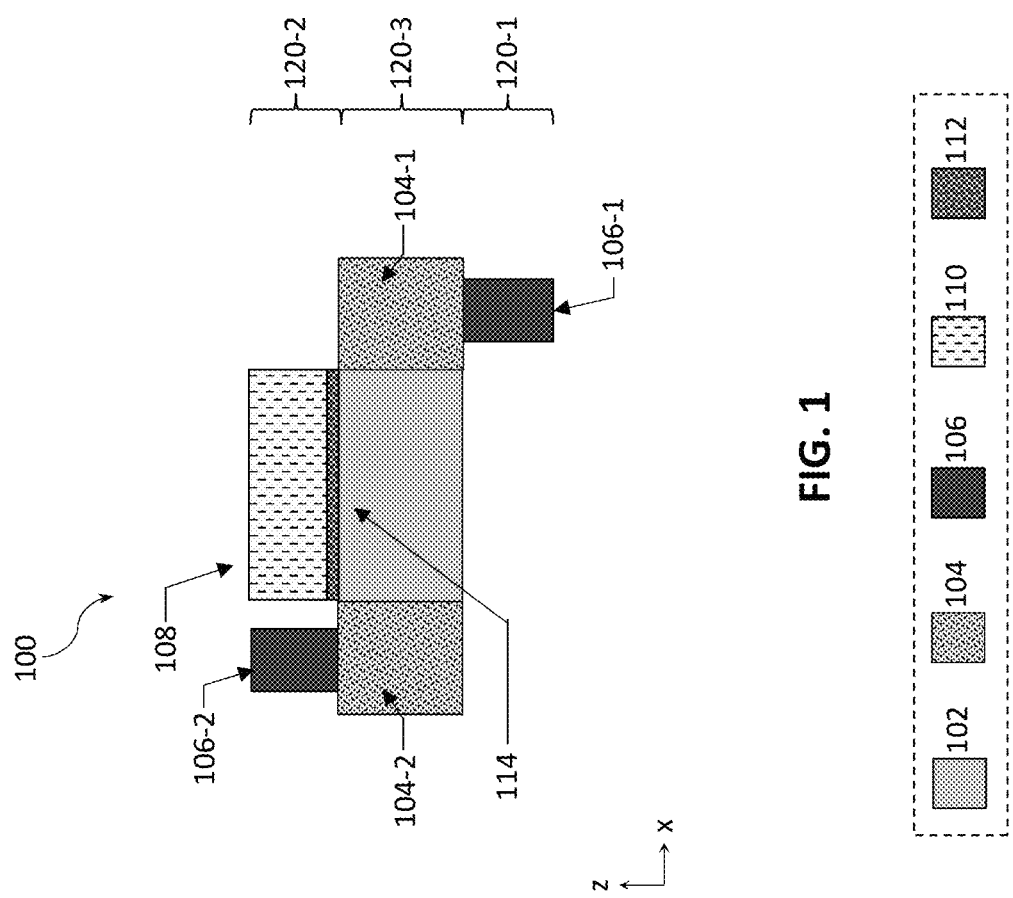

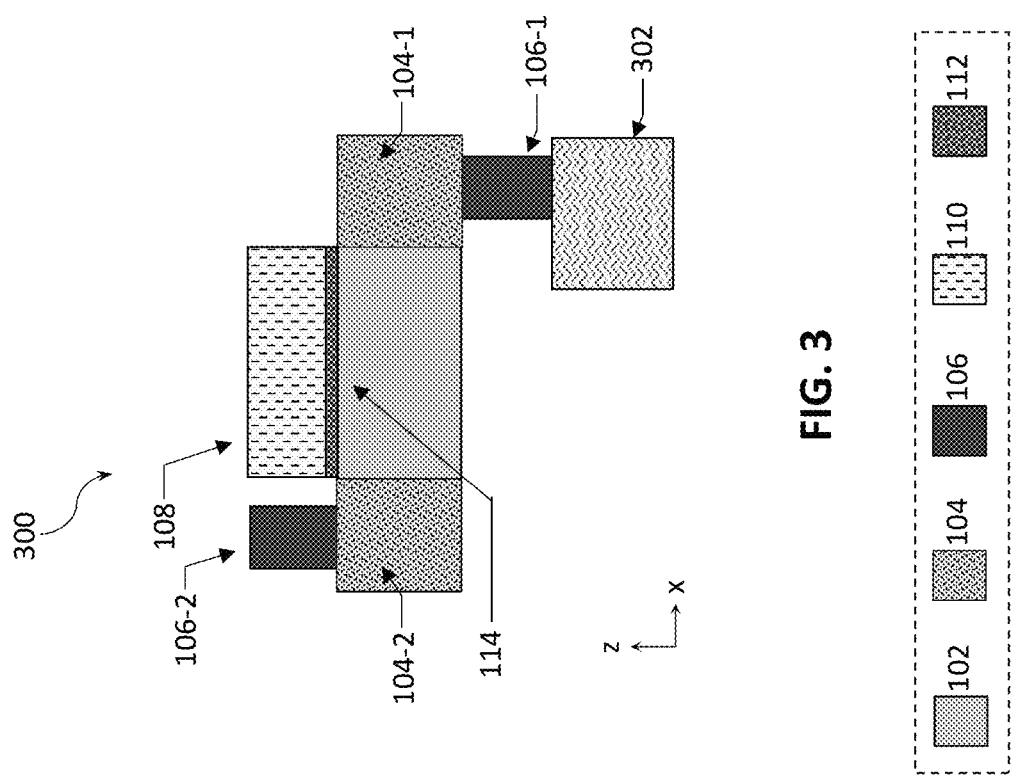

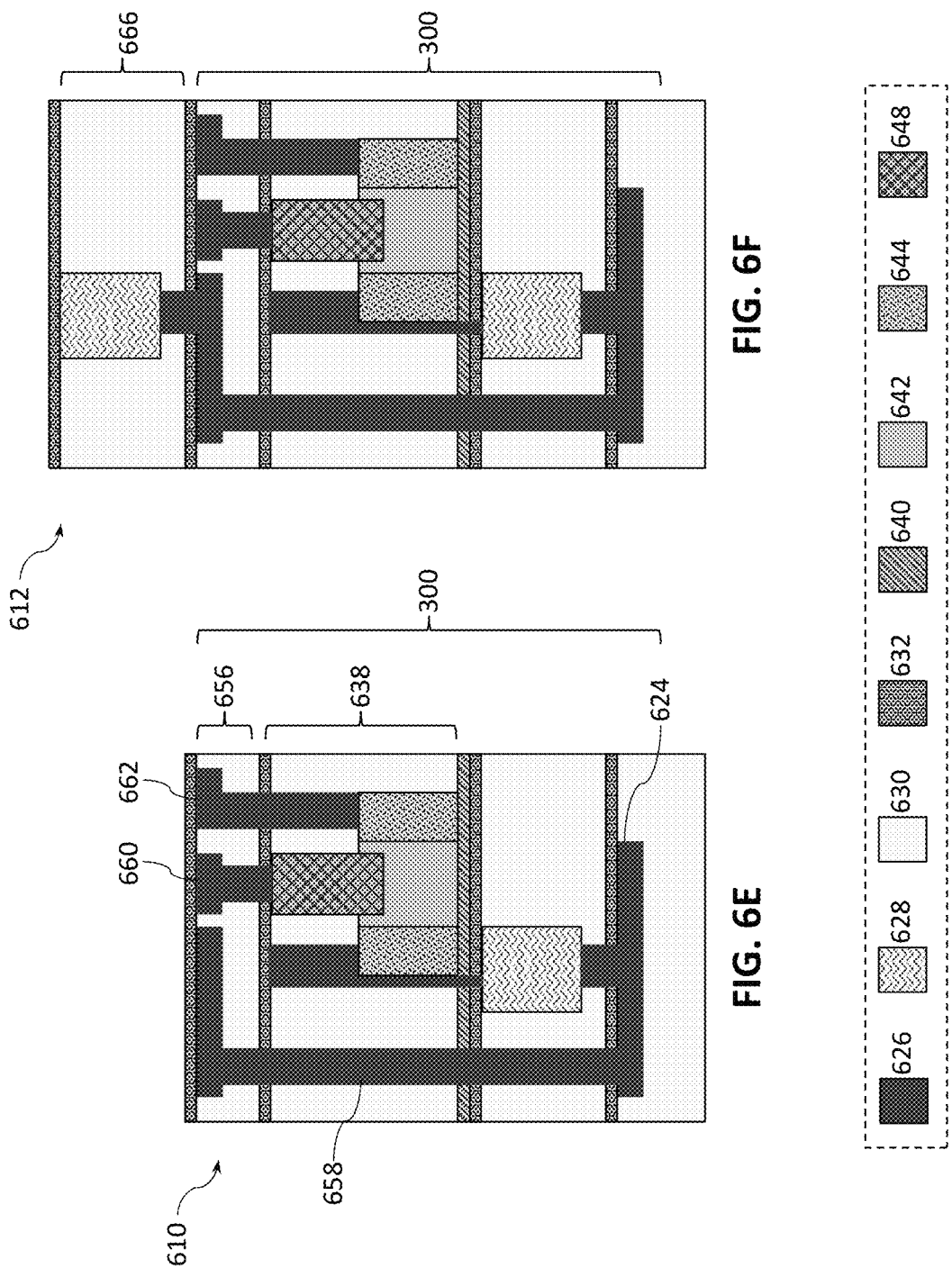

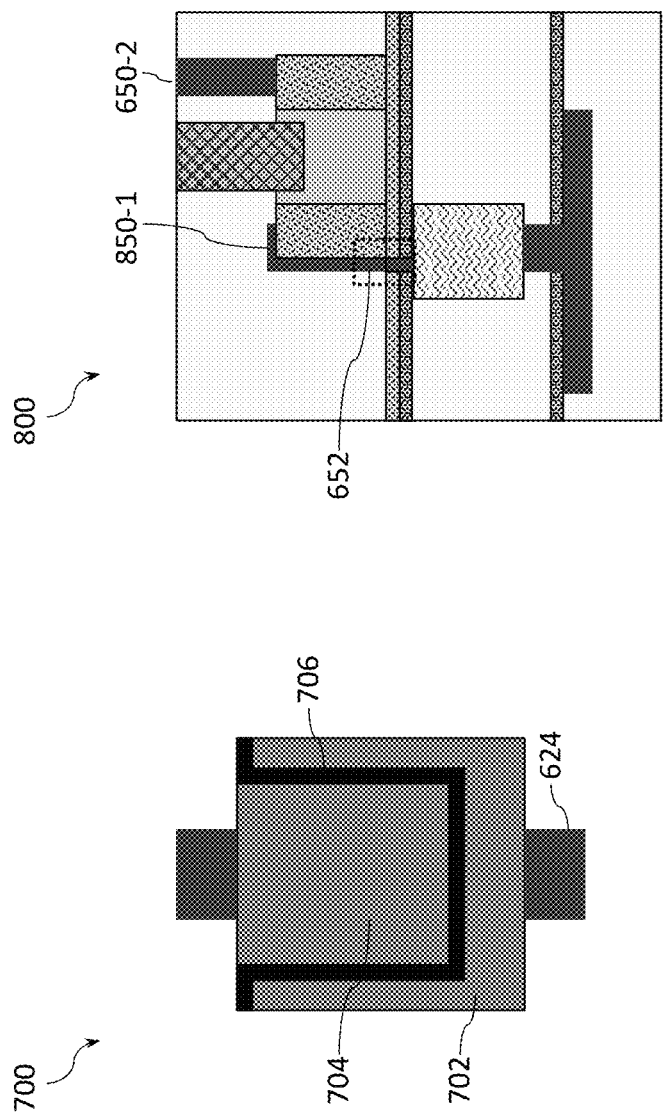

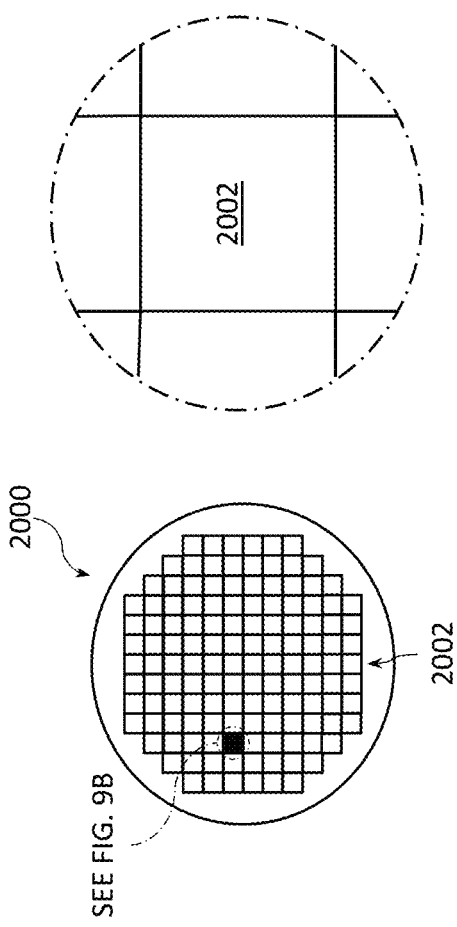

TRANSISTORS WITH BACK-SIDE CONTACTS TO CREATE THREE DIMENSIONAL MEMORY AND LOGIC

BACKGROUND

Embedded memory is important to the performance of modern system-on-a-chip (SoC) technology. Static random-access memory (SRAM) is one example of embedded memory, particularly suitable for modern SoC due to its compatibility with fabrication processes used to manufacture computing logic, e.g., front end of line (FEOL) processes. However, for some applications demanding large on-die cache, such as tens of megabytes (MBs) for handling memory bandwidth, the area and standby power of a SRAM-based cache may pose significant challenges to SoC design.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 provides a schematic illustration of a cross-sectional view of an example transistor with a back-side contact according to some embodiments of the present disclosure.

FIG. 3 provides a schematic illustration of a cross-sectional view of an example memory cell that includes a transistor with a back-side contact, according to some embodiments of the present disclosure.

FIGS. 6A-6G are cross-sectional side views, illustrating various stages in the manufacture of an example IC device according to the method of FIG. 5, according to some embodiments of the present disclosure.

FIG. 7 provides a schematic illustration of a capacitor that may be coupled to a transistor with a back-side contact, according to some embodiments of the present disclosure.

FIG. 8 provides a schematic illustration of an alternative embodiment of the example IC device with a transistor with a back-side contact, according to some embodiments of the present disclosure.

FIGS. 9A-9B are top views of a wafer and dies that may include one or more transistors with back-side contacts in accordance with any of the embodiments disclosed herein.

DETAILED DESCRIPTION

Overview

Figures 2A, 2B:
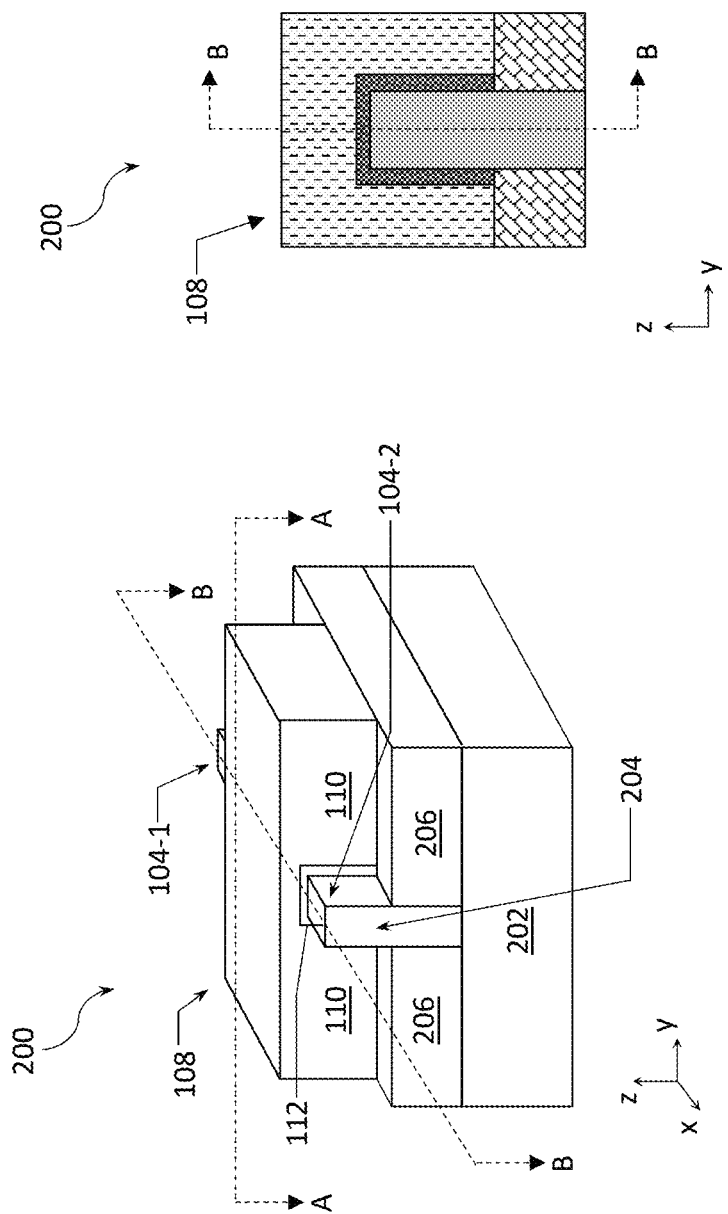
FIGS. 2A-2B are perspective and cross-sectional views, respectively, of an example transistor with a back-side contact implemented as a FinFET, according to some embodiments of the present disclosure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of large SRAM-based caches. However, embodiments of the present disclosure are equally applicable to memory cells implemented other technologies. Thus, in general, memory cells described herein may be implemented as eDRAM cells, spin-transfer torque random access memory (STTRAM) cells, resistive random-access memory (RRAM) cells, or any other non-volatile memory cells.

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) terminal of the access transistor (e.g., to the source terminal of the access transistor), while the other S/D terminal of the access transistor may be coupled to a bit-line (BL), and a gate terminal of the transistor may be coupled to a word-line (WL). Since such a memory cell can be fabricated with as little as a single access transistor, it can provide higher density and lower standby power versus SRAM in the same process technology.

Various 1T-1C memory cells have, conventionally, been implemented with access transistors being FEOL, logic-process based, transistors implemented in an upper-most layer of a semiconductor substrate. Inventors of the present disclosure realized that using conventional logic transistors creates several challenges if such transistors are to be used to create three dimensional memory and logic devices.

One challenge relates to the location of the capacitors of such memory cells. Namely, it may be desirable to provide capacitors in metal layers close to their corresponding access transistors. Since logic transistors are implemented as FEOL transistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technology nodes, embedding the capacitors in the lower metal layers poses significant challenges to the scaling of 1T-1C based memory and to creation of three dimensional memory devices.

Another challenge resides in that, given a usable surface area of a substrate, there are only so many FEOL transistors that can be formed in that area, placing a significant limitation on the density of memory cells or logic devices incorporating such transistors.

Embodiments of the present disclosure may improve on at least some of the challenges and issues described above. Conventional FEOL transistors have both S/D contacts on one side of the transistor, usually on the side facing away from the substrate. In contrast to the approaches of building logic and memory devices with such conventional FEOL transistors, various embodiments of the present disclosure provide transistors, various IC devices incorporating such transistors (e.g., logic devices, memory cells and arrays, etc.), as well as associated methods and larger devices, in which a transistor has one S/D contact on one side and another S/D contact on the other side. One side of a transistor may be referred to as a "front side" while the other side may be referred to as a "back side." Thus, transistors described herein have one of the S/D contacts on the front side (such contacts referred to as "front-side contacts") and the other one of their S/D contacts on the back side (such contacts referred to as "back-side contacts"). In the following, transistors having one front-side and one back-side S/D contacts may be simply referred to as "transistors with back-side contacts."

According to one aspect of the present disclosure, an example IC device includes a support structure (e.g., a substrate) on which one or more transistors with back-side contacts may be implemented. The IC device further includes a transistor that includes a channel material, a first S/D region, and a second S/D region. The IC device further includes a contact (i.e., an electrical contact) to the first S/D region and a contact to the second S/D region, where the contact to the first S/D region is in a first layer over the support structure, the contact to the second S/D region is in a second layer over the support structure, a portion of the channel material between the first S/D region and the second S/D region is in a third layer over the support structure, and the third layer is between the first layer and the second layer. In general, in the context of the present disclosure, a "side" of a transistor refers to a region or a layer either above or below a layer of the channel material of the transistor. Thus, in such an example IC device, one of the two S/D regions has a contact on the front side of the transistor, i.e., a contact to that S/D region is on one side with respect to the layer of the channel material of the transistor (e.g., above the channel material), and such a contact is a front-side contact. On the other hand, the other one of the two S/D regions has a contact on the back side of the transistor, i.e., a contact to that S/D region is on the other side with respect to the layer of the channel material of the transistor (e.g., below the channel material), and such a contact is a back-side contact. In the context of the present disclosure, the term "above" may refer to being further away from the support structure or the FEOL of an IC device, while the term "below" refers to being closer towards the support structure or the FEOL of the IC device.

In the following, some descriptions may refer to a particular side of the transistor being referred to as a front side and the other side being referred to as a back side to illustrate the general concept of transistors having their S/D contacts on different sides. However, unless specified otherwise, which side of a transistor is considered to be a front side and which side is considered to be a back side is not important. Therefore, descriptions of some illustrative embodiments of the front and back sides provided herein are applicable to embodiments where the designation of front and back sides may be reversed, as long as one of the S/D contacts for a transistor is provided on one side and another one—on the other, with respect to the channel layer. Furthermore, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of field-effect transistors (FETs), designations of source and drain are often interchangeable. Therefore, descriptions of some illustrative embodiments of the source and drain regions/contacts provided herein are applicable to embodiments where the designation of source and drain regions/contacts may be reversed.

While some descriptions provided herein may refer to transistors being top-gated transistors, embodiments of the present disclosure are not limited to only this design and include transistors of various other architectures, or a mixture of different architectures. For example, in various embodiments, transistors having one front-side and one back-side S/D contacts, described herein, may include bottom-gated transistors, top-gated transistors, FinFETs, nanowire transistors, planar transistors, etc., all of which being within the scope of the present disclosure. Furthermore, although descriptions of the present disclosure may refer to logic devices or memory cells provided in a given layer, each layer of the IC devices described herein may also include other types of devices besides logic or memory devices described herein. For example, in some embodiments, IC devices with memory cells incorporating transistors having one front-side and one back-side S/D contacts may also include SRAM memory cells in any of the layers.

Using transistors with one front-side and one back-side S/D contacts provides several advantages and enables unique architectures that were not possible with conventional, FEOL logic transistors with both S/D contacts being on one side. One advantage is that such transistors may be moved to the back end of line (BEOL) layers of an advanced complementary metal oxide semiconductor (CMOS) process. Moving access transistors of memory cells to the BEOL layers means that their corresponding capacitors can be implemented in the upper metal layers with correspondingly thicker interlayer dielectric (ILD) and larger metal pitch to achieve higher capacitance, which may ease the integration challenge introduced by embedding the capacitors. Another advantage is that implementing at least some of the transistors with their S/D contacts on different sides allows substantial flexibility to making electrical connections to these transistors. Consequently, at least portions of logic devices and memory cells incorporating such transistors may be provided in different layers above the support structure, thus enabling three dimensional memory and logic devices and, in particular, enabling a stacked architecture with many layers of memory and/or logic devices. Providing three dimensional memory and/or logic devices as described herein allows significantly increasing density of these devices (e.g., density of memory cells in a memory array) having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of a structure with a given density of memory and/logic devices. Furthermore, by embedding at least some, but preferably all, of the access transistors and the corresponding capacitors in the upper metal layers (i.e., in layers away from the support structure) according to at least some embodiments of the present disclosure, the peripheral circuits that control the memory operation can be hidden below the memory area to substantially reduce the memory macro array (i.e., the footprint area in the x-y plane of an example coordinate system shown in the drawings of the present disclosure). Transistors with back-side contacts as described herein may be used, for example, to address the scaling challenge of logic transistor (e.g., FEOL) based 1T-1C memory technology and enable high density embedded memory compatible with an advanced CMOS process. Other technical effects will be evident from various embodiments described here.

As used herein, the term "metal layer" refers to a layer above a support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 6A-6G, such a collection may be referred to herein without the letters, e.g., as "FIG. 6."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with transistors having one front-side and one back-side S/D contacts as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Transistor Architectures

FIG. 1 provides a schematic illustration of a cross-sectional view of an example transistor 100, implemented as a FET, with a back-side contact according to some embodiments of the present disclosure.

A number of elements labeled in FIG. 1 and in at least some of the subsequent figures with reference numerals are illustrated in these figures with different patterns, with a legend showing the correspondence between the reference numerals and patterns being provided at the bottom of each drawing page containing these figures. For example, the legend illustrates that FIG. 1 uses different patterns to show a channel material 102, S/D regions 104, contacts 104 to S/D regions, etc. Furthermore, although a certain number of a given element may be illustrated in FIG. 1 and in at least some of the subsequent figures, this is also simply for ease of illustration, and more, or less, than that number may be included in an IC device according to various embodiments of the present disclosure. Still further, various IC device views shown in FIG. 1 and in at least some of the subsequent figures are intended to show relative arrangements of various elements therein, and that various IC devices, or portions thereof, may include other elements or components that are not illustrated (e.g., any further materials, such as e.g. spacer materials that may surround the gate stack of the transistor 100, etch-stop materials, etc.).

In general, a FET, e.g., a metal oxide semiconductor (MOS) FET (MOSFET), is a three-terminal device that includes source, drain, and gate terminals and uses electric field to control current flowing through the device. A FET typically includes a channel material, a source region and a drain regions provided in the channel material, and a gate stack that includes a gate electrode material, alternatively referred to as a "work function" (WF) material, provided over a portion of the channel material between the source and the drain regions, and, optionally, also includes a gate dielectric material between the gate electrode material and the channel material. This general structure is shown in FIG. 1, illustrating a channel material 102, S/D regions 104 (shown as a first S/D region 104-1, e.g., a source region, and a second S/D region 104-2, e.g., a drain region), contacts 106 to S/D regions (shown as a first S/D contact 106-1, providing electrical contact to the first S/D region 104-1, and a second S/D contact 106-2, providing electrical contact to the second S/D region 104-2), and a gate stack 108, which includes at least a gate electrode 110 and may also, optionally, include a gate dielectric 112.

Implementations of the present disclosure may be formed or carried out on a support structure, which may be, e.g., a substrate, a die, a wafer or a chip. The substrate may, e.g., be the wafer 2000 of FIG. 9A, discussed below, and may be, or be included in, a die, e.g., the singulated die 2002 of FIG. 9B, discussed below. The substrate may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the substrate may be a printed circuit board (PCB) substrate. Although a few examples of materials from which the substrate may be formed are described here, any material that may serve as a foundation upon which a semiconductor device implementing any of the transistors having one front-side and one back-side S/D contacts as described herein may be built falls within the spirit and scope of the present disclosure. In various embodiments, the channel material 102 may include, or may be formed upon, any such substrate material that provides a suitable surface for forming the transistor 100.

In some embodiments, the channel material 102 may be composed of semiconductor material systems including, for example, N-type or P-type materials systems. In some embodiments, the channel material 102 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 102 may include a combination of semiconductor materials where one semiconductor material may be used for the channel portion (e.g., a portion 114 shown in FIG. 1, which is supposed to refer to the upper-most portion of the channel material 102) and another material, sometimes referred to as a "blocking material," may be used between the channel portion 114 and the support structure over which the transistor 100 is provided. In some embodiments, the channel material 102 may include a monocrystalline semiconductor, such as silicon (Si) or germanium (Ge). In some embodiments, the channel material 102 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 100 is an NMOS), the channel portion 114 of the channel material 102 may advantageously include a III-V material having a high electron mobility, such as, but not limited to InGaAs, InP, InSb, and InAs. For some such embodiments, the channel portion 114 of the channel material 102 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 114 of the channel material 102 may be an intrinsic III-V material, i.e., a III-V semiconductor material not intentionally doped with any electrically active impurity. In alternate embodiments, a nominal impurity dopant level may be present within the channel portion 114 of the channel material 102, for example to further fine-tune a threshold voltage Vt, or to provide HALO pocket implants, etc. Even for impurity-doped embodiments however, impurity dopant level within the channel portion 114 of the channel material 102 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 100 is a PMOS), the channel portion 114 of the channel material 102 may advantageously be a group IV material having a high hole mobility, such as, but not limited to Ge or a Ge-rich SiGe alloy. For some example embodiments, the channel portion 114 of the channel material 102 may have a Ge content between 0.6 and 0.9, and advantageously may be at least 0.7. In some embodiments with highest mobility, the channel portion 114 may be intrinsic III-V (or IV for P-type devices) material and not intentionally doped with any electrically active impurity. In alternate embodiments, one or more a nominal impurity dopant level may be present within the channel portion 114, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 100 may be a thin film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 100 is a TFT, the channel material 102 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 100 is a TFT, the channel material 102 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 102 may have a thickness between about 5 and 75 nanometers, including all values and ranges therein. In some embodiments, a thin film channel material 102 may be deposited at relatively low temperatures, which allows depositing the channel material 102 within the thermal budgets imposed on back end fabrication to avoid damaging other components, e.g., front end components such as the logic devices.

As shown in FIG. 1, a first and a second S/D regions 104-1, 104-2 (together referred to as "S/D regions 104") may be included on either side of the gate stack 108, thus realizing a transistor. As is known in the art, source and drain regions (also sometimes interchangeably referred to as "diffusion regions") are formed for the gate stack of a FET. In some embodiments, the S/D regions 104 of the transistor 100 may be regions of doped semiconductors, e.g. regions of the channel material 102 (e.g., of the channel portion 114) doped with a suitable dopant to a suitable dopant concentration, so as to supply charge carriers for the transistor channel. In some embodiments, the S/D regions 104 may be highly doped, e.g. with dopant concentrations of about $1 \cdot 10^{21}$ $cm^{-3}$, in order to advantageously form Ohmic contacts with the respective S/D contacts 106, although, in other embodiments, these regions may also have lower dopant concentrations and may form Schottky contacts in some implementations. Irrespective of the exact doping levels, the S/D regions 104 of the transistor 100 may be the regions having dopant concentration higher than in other regions, e.g. higher than a dopant concentration in a region of the channel material 102 between the first S/D region 104-1 and the second S/D region 104-2, and, therefore, may be referred to as "highly doped" (HD) regions. In some embodiments, the S/D regions 104 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 102 to form the S/D regions 104. An annealing process that activates the dopants and causes them to diffuse further into the channel material 102 may follow the ion implantation process. In the latter process, the one or more semiconductor materials of the channel material 102 may first be etched to form recesses at the locations for the future S/D regions. An epitaxial deposition process may then be carried out to fill the recesses with material (which may include a combination of different materials) that is used to fabricate the S/D regions 104. In some implementations, the S/D regions 104 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 104 may be formed using one or more alternate semiconductor materials such as germanium or a group III-V material or alloy. Although FIG. 1 illustrates the first and second S/D regions 104 with a single pattern, suggesting that the material composition of the first and second S/D regions 104 is the same, this may not be the case in some other embodiments of the transistor 100. Thus, in some embodiments, the material composition of the first S/D region 104-1 may be different from the material composition of the second S/D region 104-2.

As further shown in FIG. 1, S/D contacts 106-1 and 106-2 (together referred to as "S/D contacts 106"), formed of one or more electrically conductive materials, may be used for providing electrical connectivity to the S/D regions 104-1 and 104-2, respectively. In various embodiments, one or more layers of metal and/or metal alloys may be used to form the S/D contacts 106. For example, the electrically conductive materials of the S/D contacts 106 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 106 may include one or more electrically conductive alloys, oxides, or carbides of one or more metals. In some embodiments, the S/D contacts 106 may include a doped semiconductor, such as silicon or another semiconductor doped with an N-type dopant or a P-type dopant. Metals may provide higher conductivity, while doped semiconductors may be easier to pattern during fabrication. Although FIG. 1 illustrates the first and second S/D contacts 106 with a single pattern, suggesting that the material composition of the first and second S/D contacts 106 is the same, this may not be the case in some other embodiments of the transistor 100. Thus, in some embodiments, the material composition of the first S/D contact 106-1 may be different from the material composition of the second S/D contact 106-2.

Turning to the gate stack 108, the gate electrode 110 may include at least one P-type work function metal or N-type work function metal, depending on whether the transistor 100 is a P-type metal oxide semiconductor (PMOS) transistor or an N-type metal oxide semiconductor (NMOS) transistor. For a PMOS transistor, metals that may be used for the gate electrode 110 may include, but are not limited to, ruthenium, palladium, platinum, cobalt, nickel, and conductive metal oxides (e.g., ruthenium oxide). For an NMOS transistor, metals that may be used for the gate electrode 110 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 110 may include a stack of two or more metal layers, where one or more metal layers are WF metal layers and at least one metal layer is a fill metal layer. Further metal layers may be included for other purposes, such as to act as a diffusion barrier layer, described below.

If used, the gate dielectric 112 may at least laterally surround the channel portion 114, and the gate electrode 110 may laterally surround the gate dielectric 112 such that the gate dielectric 112 is disposed between the gate electrode 110 and the channel material 104. In various embodiments, the gate dielectric 112 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 112 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 112 during manufacture of the transistor 100 to improve the quality of the gate dielectric 112. In some embodiments, the gate dielectric 112 may have a thickness between about 0.5 nanometers and 3 nanometers, including all values and ranges therein, e.g., between about 1 and 3 nanometers, or between about 1 and 2 nanometers.

In some embodiments, the gate dielectric 112 may be a multilayer gate dielectric, e.g., it may include any of the high-k dielectric materials in one layer and a layer of indium gallium zinc oxide (IGZO). In some embodiments, the gate stack 108 may be arranged so that the IGZO is disposed between the high-k dielectric and the channel material 104. In such embodiments, the IGZO may be in contact with the channel material 104, and may provide the interface between the channel material 104 and the remainder of the multilayer gate dielectric 112. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate stack 108 may be surrounded by a dielectric spacer, not specifically shown in FIG. 1. The dielectric spacer may be configured to provide separation between the gate stacks 108 of different transistors 100 which may be provided adjacent to one another (e.g., different transistors 100 provided along a single fin if the transistors 100 are FinFETs), as well as between the gate stack 108 and one of the S/D contacts 106 that is disposed on the same side as the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In stark contrast to conventional implementations where both S/D contacts are typically provided on a single side of a transistor, typically on the front side, e.g., where the gate stack 108 is provided, the two S/D contacts 106 are provided on different sides. Namely, as shown in FIG. 1, the second S/D contact 106-2 is provided on the same side as the gate stack 108, which may be considered to be the front side of the transistor 100, while the first S/D contact 106-1 is provided on the opposite side, which may be considered to be the back side of the transistor 100. Thus, the first S/D contact 106-1 is the back-side contact and the second S/D contact 106-2 is the front-side contact of the transistor 100. If considering the layers above a support structure (not shown in FIG. 1) over which the entire transistor 100 is built, then the first S/D contact 106-1 may be considered to be in a first layer 120-1 above the support structure, the second S/D contact 106-2 may be considered to be in a second layer 120-2 above the support structure, and a portion of the channel material 102 between the first S/D region 104-1 and the second S/D region 104-2 (e.g., the channel portion 114) is in a third layer 120-3 over the support structure. As can be seen from FIG. 1, the third layer 120-3 is between the first layer 120-1 and the second layer 120-2. At least a portion of the gate stack 108, or a contact to the gate stack 108 (such a gate contact not specifically shown in FIG. 1), may be provided in the same layer as one of the S/D contacts 106, e.g., in the second layer 120-2, as shown in FIG. 1.

Transistors having one front-side and one back-side S/D contacts as described herein, such as the transistor 100, may be implemented using any suitable transistor architecture, e.g. planar or non-planar architectures. One example structure is shown in FIGS. 2A-2B, illustrating perspective and cross-sectional views, respectively, of an example IC device 200 having a transistor with a back-side contact implemented as a FinFET, according to some embodiments of the present disclosure. Thus, the IC device 200 illustrates one example implementation of the transistor 100. Therefore, some of the reference numerals shown in FIGS. 2A-2B are the same as those used in FIG. 1, indicating the same or similar elements as those described with reference to FIG. 1, so that their descriptions are not repeated for FIGS. 2A-2B.

FinFETs refer to transistors having a non-planar architecture where a fin, formed of one or more semiconductor materials, extends away from a base (where the term "base" refers to any suitable support structure on which a transistor may be built, e.g., a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and, optionally, a layer of a gate dielectric may be provided over the top and sides of the remaining upper portion of the fin (i.e. the portion above and not enclosed by the STI), thus wrapping around the upper-most portion of the fin. The portion of the fin over which the gate stack wraps around is typically referred to as a "channel portion" of the fin because this is where, during operation of the transistor, a conductive channel forms, and is a part of an active region of the fin. A source region and a drain region are provided on the opposite sides of the gate stack, forming, respectively, a source and a drain terminal of a transistor. FinFETs may be implemented as "tri-gate transistors," where the name "tri-gate" originates from the fact that, in use, such transistors may form conducting channels on three "sides" of the fin. FinFETs potentially improve performance relative to single-gate transistors and double-gate transistors.

FIG. 2A is a perspective view, while FIG. 2B is a cross-sectional side view of an IC device/FinFET 200 with one front-side and one back-side S/D contact, according to some embodiments of the disclosure. FIGS. 2A-2B illustrate the channel material 102, the S/D regions 104, and the gate stack 108 showing the gate electrode 110 and the gate dielectric 112 as described above. As shown in FIGS. 2A-2B, when the transistor 100 is implemented as a FinFET, the FinFET 200 may further include a base 202, a fin 204, and an STI material 206 enclosing the subfin portion of the fin 204. The S/D contacts 106 are not specifically shown in FIGS. 2A-2B in order to not clutter the drawings. The cross-sectional side view of FIG. 2B is the view in the y-z plane of the example coordinate system x-y-z shown in FIG. 2A, with the cross section of FIG. 2B taken across the fin 204 (e.g., along the plane shown in FIG. 2A as a plane AA). On the other hand, the cross-sectional side view of FIG. 1 is the view in the x-z plane of the example coordinate system shown in FIG. 2A with the cross section taken along the fin 204 for one example portion of the gate stack 108 (e.g., along the plane shown in FIG. 2A and in FIG. 2B as a plane BB).

As shown in FIGS. 2A-2B, the fin 204 may extend away from the base 202 and may be substantially perpendicular to the base 202. The fin 204 may include one or more semiconductor materials, e.g. a stack of semiconductor materials, so that the upper-most portion of the fin (namely, the portion of the fin 204 enclosed by the gate stack 108) may serve as the channel region of the FinFET 200. Therefore, the upper-most portion of the fin 204 may be formed of the channel material 102 as described above and may include the channel portion 114.

The subfin of the fin 204 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For some example N-type transistor embodiments, the subfin portion of the fin 204 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 200 where the channel portion of the fin 204 (e.g., the channel portion 114) is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 204 are each, or include, group IV semiconductors (e.g., Si, Ge, SiGe). The subfin of the fin 204 may be a first elemental semiconductor (e.g., Si or Ge) or a first SiGe alloy (e.g., having a wide bandgap). For some example P-type transistor embodiments, the subfin of the fin 204 may be a group IV material having a band offset (e.g., valance band offset for P-type devices) from the channel portion. Example materials, include, but are not limited to, Si or Si-rich SiGe. In some P-type transistor embodiments, the subfin of the fin 204 is Si and at least a portion of the subfin may also be doped with impurities (e.g., N-type) to a higher impurity level than the channel portion.

As further shown in FIGS. 2A-2B, the STI material 206 may enclose portions of the sides of the fin 204. A portion of the fin 204 enclosed by the STI 106 forms a subfin. In various embodiments, the STI material 206 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 206 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 108 may wrap around the upper portion of the fin 204 (the portion above the STI 206), as shown in FIGS. 2A-2B, with a channel portion of the fin 204 (e.g., the channel portion 114, described above) corresponding to the portion of the fin 204 wrapped by the gate stack 108 as shown in FIGS. 2A-2B. In particular, the gate dielectric 112 (if used) may wrap around the upper-most portion of the fin 204, and the gate electrode 110 may wrap around the gate dielectric 112. The interface between the channel portion and the subfin portion of the fin 204 is located proximate to where the gate electrode 110 ends.

In some embodiments, the FinFET 200 may have a gate length, GL, (i.e. a distance between the first S/D region 104-1 and the second S/D region 104-2), a dimension measured along the fin 204 in the direction of the x-axis of the example reference coordinate system x-y-z shown in FIG. 1 and FIGS. 2A-2B, which may, in some embodiments, be between about 5 and 40 nanometers, including all values and ranges therein (e.g. between about 22 and 35 nanometers, or between about 20 and 30 nanometers). The fin 204 may have a thickness, a dimension measured in the direction of the y-axis of the reference coordinate system x-y-z shown in FIGS. 2A-2B, that may, in some embodiments, be between about 5 and 30 nanometers, including all values and ranges therein (e.g. between about 7 and 20 nanometers, or between about 10 and 15 nanometers). The fin 204 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 204 illustrated in FIGS. 2A-2B is shown as having a rectangular cross section in a y-z plane of the reference coordinate system shown, the fin 204 may instead have a cross section that is rounded or sloped at the "top" of the fin 204, and the gate stack 108 may conform to this rounded or sloped fin 204. In use, the FinFET 200 may form conducting channels on three "sides" of the channel portion of the fin 204, potentially improving performance relative to single-gate transistors (which may form conducting channels on one "side" of a channel material or substrate) and double-gate transistors (which may form conducting channels on two "sides" of a channel material or substrate).

While not specifically shown in FIG. 2A, S/D contacts 106 may be electrically connected to the S/D regions 104, but extending in different vertical directions with respect to the fin 204. For example, the first S/D contact 106-1 may be electrically connected to the first S/D region 104-1 and extend from the first S/D region 104-1 towards the base 202, thus forming a back-side S/D contact for the FinFET 200, similar to the illustration of FIG. 1. In such implementation, the second S/D contact 106-2 may be electrically connected to the second S/D region 104-2 and extend from the second S/D region 104-2 away from the base 202, thus forming a front-side S/D contact for the FinFET 200, also similar to the illustration of FIG. 1.

While FIGS. 2A-2B illustrate a single FinFET 200, in some embodiments, a plurality of FinFETs may be arranged next to one another (with some spacing in between) along the fin 204. Furthermore, in various further embodiments, the transistor 100 with one front-side and one back-side S/D contacts may be implemented in many other transistor architectures besides the FinFET 200, such as planar FETs, nanowire FETs, or nanoribbon FETs.

Example Memory Cell

FIG. 3 provides a schematic illustration of a cross-sectional view of an example memory cell 300 that includes a transistor with a back-side contact, according to some embodiments of the present disclosure. FIG. 3 illustrates how the transistor 100 may be used to form a 1T-1C memory cell. In particular, the memory cell 300 illustrates all of the components of the transistor 100 of FIG. 1 (the descriptions of which, therefore, not repeated here), and further schematically illustrates that, in some embodiments, a capacitor 302 may be coupled to the back-side S/D contact 106-1 of the transistor 100. The capacitor 302 may be any suitable capacitor, e.g., a metal-insulator-metal (MIM) capacitor for storing a bit value, or a memory state (e.g., logical "1" or "0") of the memory cell 300, and the transistor 100 may then function as an access transistor controlling access to the memory cell 300 (e.g., access to write information to the cell or access to read information from the cell. By coupling the capacitor 302 to the S/D region 104-1, the capacitor 302 is configured to store the memory state of the memory cell 300. In some embodiments, the capacitor 302 may be coupled to the S/D region 104-1 via a storage node (not specifically shown in FIG. 3) coupled to the S/D region 104-1. In some embodiments, the S/D contact 106-1 may be considered to be the storage node.

Although not specifically shown in FIG. 3, the memory cell 300 may further include a bitline to transfer the memory state and coupled to the one of the S/D regions 104 to which the capacitor 302 is not coupled (e.g., to the S/D region 104-2, for the illustration of FIG. 3). Such a bitline can be connected to a sense amplifier and a bitline driver which may, e.g., be provided in a memory peripheral circuit associated with a memory array in which the memory cell 300 may be included. Furthermore, although also not specifically shown in FIG. 3, the memory cell 300 may further include a wordline, coupled to the gate terminal of the transistor 100, e.g., coupled to the gate stack 108, to supply a gate signal. The transistor 100 may be configured to control transfer of a memory state of the memory cell 300 between the bitline and the storage node or the capacitor 302 in response to the gate signal.

Example Layering

Figure 4:
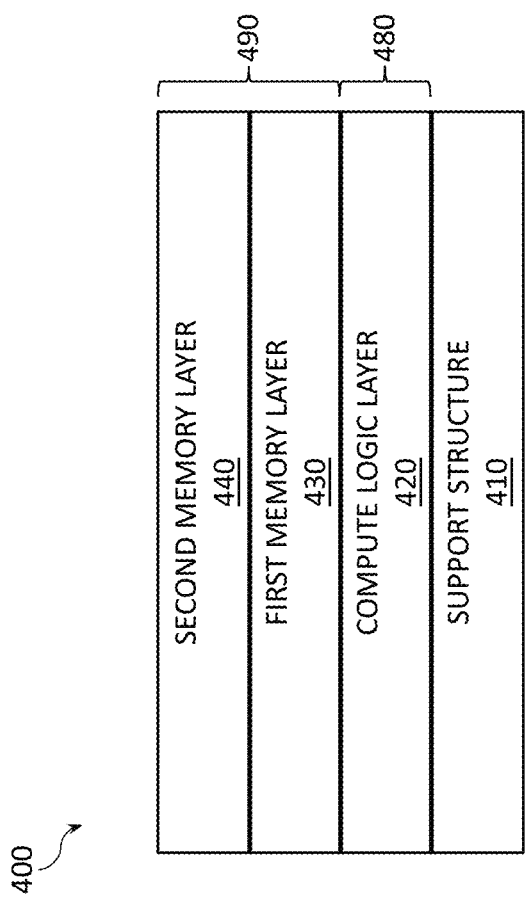
FIG. 4 provides a schematic illustration of an integrated circuit (IC) device with multiple layers of memory and logic that may include transistors with back-side contacts, according to some embodiments of the present disclosure.

FIG. 4 provides a schematic illustration of a cross-sectional view of an example IC device 400 with multiple layers of memory and logic that may include transistors having one front-side and one back-side S/D contacts, according to some embodiments of the present disclosure. As shown in FIG. 4, in general, the IC device 400 may include a support structure 410, a compute logic layer 420, a first memory layer 430, and a second memory layer 490.

The support structure 410 may, e.g., be a substrate, a die, a wafer or a chip, and may include any of the materials, or combinations of materials, described above with reference to FIG. 1.

The first and second memory layers 430, 440 may, together, be seen as forming a memory array 490. As such, the memory array 490 may include access transistors (e.g., the transistor 100), capacitors, as well as wordlines (e.g., row selectors) and bitlines (e.g., column selectors), making up memory cells. On the other hand, the compute logic layer 420 may include various logic layers, circuits, and devices (e.g., logic transistors) to drive and control a logic IC. For example, the logic devices of the compute logic layer 420 may form a memory peripheral circuit 480 to control (e.g., access (read/write), store, refresh) the memory cells of the memory array 490.

In some embodiments, the compute logic layer 420 may be provided in a FEOL with respect to the support structure 410. In some embodiments, the compute logic layer 420 may be provided in a FEOL and in one or more lowest BEOL layers (i.e., in one or more BEOL layers which are closest to the support structure 410), while the first memory layer 430 and the second memory layer 440 may be seen as provided in respective BEOL layers. Various BEOL layers may be, or include, metal layers. Various metal layers of the BEOL may be used to interconnect the various inputs and outputs of the logic devices in the compute logic layer 420 and/or of the memory cells in the memory layers 430, 440. Generally speaking, each of the metal layers of the BEOL may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

In other embodiments of the IC device 400, the compute logic layer 420 may be provided above the memory layers 430, 440, in between memory layers 430, 440, or combined with the memory layers 430, 440.

Transistors with one front-side and one back-side S/D contacts as described herein, either as a stand-alone transistors (e.g., the transistor 100) or included as a part of a memory cell (e.g., the memory cell 300), may be included in various regions/locations in the IC device 400. For example, the transistor 100 may be used as, e.g., a logic transistor in the compute logic layer 420. In another example, the transistor 100 may be used as, e.g., an access transistor in the first or second memory layers 430, 440. Providing the S/D contacts on different faces of a transistor may be particularly advantageous for incorporating such a transistor in a BEOL layer of the IC device 400, which may ease the integration challenge introduced by embedding the capacitors of memory cells, and make building of three dimensional memory and logic devices with a stacked architecture with many layers of memory and/or compute logic feasible.

The illustration of FIG. 4 is intended to provide a general orientation and arrangement of various layers with respect to one another, and, unless specified otherwise in the present disclosure, includes embodiments of the IC device 400 where portions of elements described with respect to one of the layers shown in FIG. 4 may extend into one or more, or be present in, other layers. For example, power and signal interconnects for the various components of the IC device 400 may be present in any of the layers shown in FIG. 4, although not specifically illustrated in FIG. 4. Furthermore, although two memory layers 430, 440 are shown in FIG. 4, in various embodiments, the IC device 400 may include any other number of one or more of such memory layers.

Example Fabrication Method

IC devices with transistors having one front-side and one back-side S/D contacts, as described herein, may be fabricated using any suitable techniques, e.g., subtractive, additive, damascene, dual damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

Figure 5:
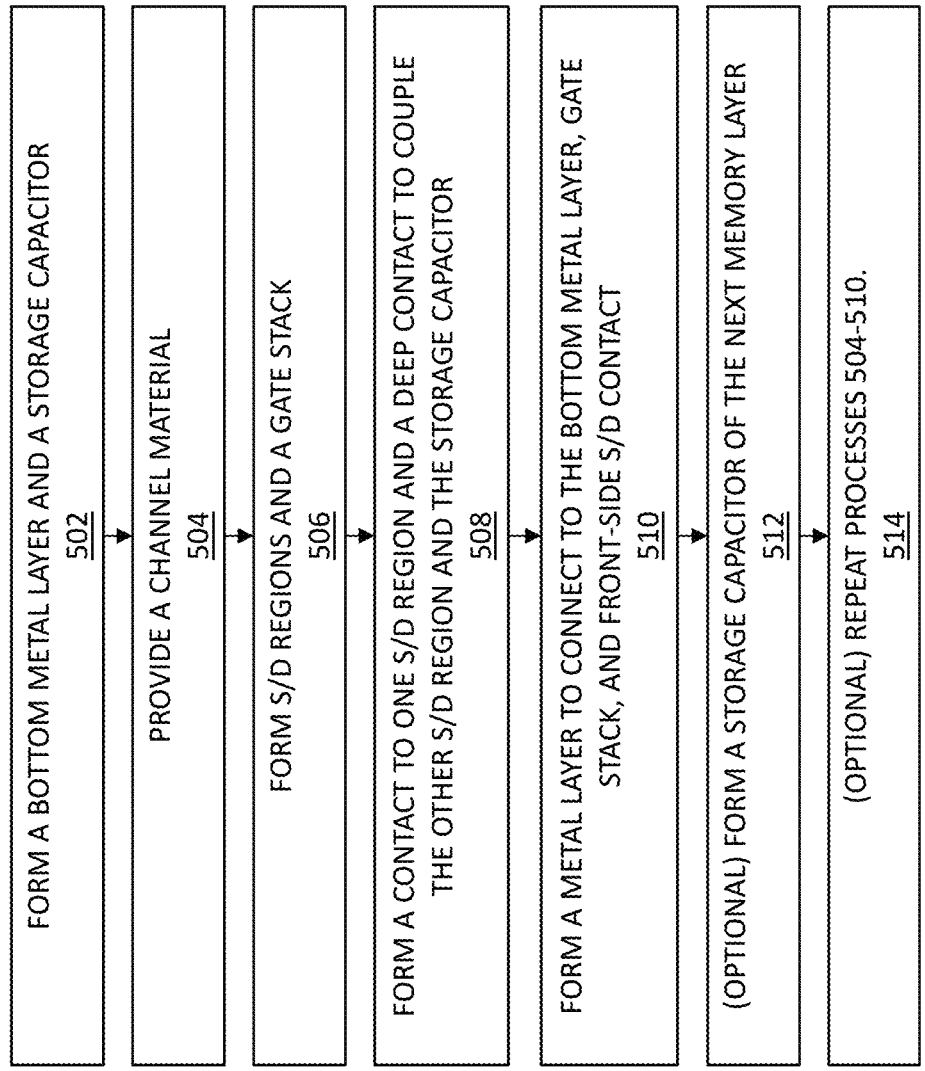
FIG. 5 illustrates an example method of forming an example IC device with one or more transistors with back-side contacts, according to some embodiments of the present disclosure.

FIG. 5 illustrates an example method 500 of forming an IC device with one or more transistors having one front-side and one back-side S/D contacts, according to some embodiments of the present disclosure. FIGS. 6A-6G illustrate cross-sectional side views for various stages in the manufacture of an example IC device according to the method 500 of FIG. 5, in accordance with some embodiments.

The example IC device shown in FIGS. 6A-6G includes a 1T-1C memory cell, e.g., the memory cell 300. In particular, FIGS. 6A-6G illustrate one specific arrangement of an IC device that includes a memory cell with an access transistor having one front-side and one back-side S/D contacts, to provide a general illustration of the method 500. However, in other embodiments, IC devices built according to the method 500 may include components and arrangements which are different from those shown in FIGS. 6A-6G. Thus, although some of the manufacturing operations of the method 500 may be discussed below with reference to particular embodiments of the IC device as shown in FIGS. 6A-6G, at least some of these operations and/or operations with minor modifications may be applied to manufacturing many different embodiments of the IC devices with transistors having one front-side and one back-side S/D contacts as discussed herein.

In addition, although the operations of the method 500 are illustrated in FIG. 5 once each and in a particular order, the operations may be performed in any suitable order and repeated as desired. For example, one or more operations may be performed in parallel to manufacture multiple transistors having one front-side and one back-side S/D contacts and/or to manufacture multiple memory arrays with such transistors substantially simultaneously. In another example, the operations may be performed in a different order to reflect the architecture of a particular device component in which one or more transistors having one front-side and one back-side S/D contacts as described herein are to be included. In yet another example, some operations may be combined into a single operation, and some operations may be subdivided into more operations than what is shown in FIG. 5.

Furthermore, the method 500 may also include operations not specifically shown in FIG. 5. In one example, such operations may include various cleaning operations as known in the art. For example, in some embodiments, device assemblies may be cleaned prior to and/or after any of the processes of the method 500 described herein, e.g. to remove surface-bound organic and metallic contaminants, as well as subsurface contamination, to promote adhesion, and/or to decrease interdiffusion of materials. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In some embodiments, cleaning may be carried out using chemical or plasma clean, or applying heat in a controlled environment. In another example, in some embodiments, device assemblies may be planarized/polished before or after each of the processes shown in FIG. 5. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of one or more materials which may cover upper surfaces of the assemblies, e.g., to expose surfaces of underlying materials for subsequent etch.

In FIGS. 6A-6G, only one of certain elements may be labeled with a reference numeral but several of those may be illustrated. A number of elements labeled in FIGS. 6A-6G with reference numerals are illustrated in these figures with different patterns, with a legend showing the correspondence between the reference numerals and patterns being provided at the bottom of each drawing page containing FIGS. 6A-6G. For example, the legend illustrates that FIGS. 6A-6G use different patterns to show an electrically conductive material 626, a capacitor 628, a gate stack 648, etc. Furthermore, although a certain number of a given element may be illustrated in FIGS. 6A-6G (e.g., a certain number of metal layers), this is also simply for ease of illustration, and more, or less, than that number may be included in an IC device according to various embodiments of the present disclosure. Still further, various IC device views shown in FIGS. 6A-6G are intended to show relative arrangements of various elements therein, and that various IC devices, or portions thereof, may include other elements or components that are not illustrated (e.g., various spacers and diffusion barrier layers are not illustrated in FIGS. 6A-6G).

Figure 6A:
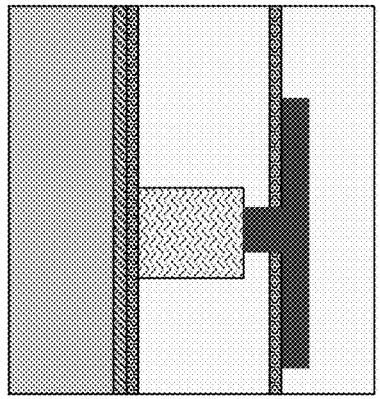

Turning to FIG. 5, the method 500 may begin a process 502 that involves forming a bottom metal layer and a storage capacitor over a support structure. An IC device 602, depicted in FIG. 6A, illustrates an example result of the process 502. As shown in FIG. 6A, the IC device 602 may include a support structure 622, a bottom metal layer having an interconnect structure 624 formed of an electrically conductive material 626, and a storage capacitor 628. FIG. 6A illustrates that, in some embodiments, the capacitor 628 and at least a portion of the interconnect structure 624 may be provided in different metal layers, meaning that they may be provided in different layers of a dielectric material 630, where the different layers of the dielectric material 630 may be separated by an etch-stop material 632, as known in the field of IC device manufacturing.

The support structure 622 may be a support structure as described above with reference to FIG. 1. In order to not clutter the drawings, subsequent FIGS. 6B-6G do not specifically show the support structure 622. Also not all of the elements labeled with a reference numeral in one of FIGS. 6A-6G are labeled in other figures, also in order to not clutter the drawings (e.g., the bottom interconnect structure 624 is not labeled in the subsequent FIGS. 6B-6G).

The dielectric material 630 may include any of the ILD materials described above, e.g., silicon oxide, carbon-doped silicon oxide, silicon carbide, silicon nitride, aluminum oxide, and/or silicon oxynitride. If etch-stop layers as shown in FIG. 6A are used in the IC device 602, the etch-stop material 632 may include, e.g., silicon nitride. In such a case, a portion of the interconnect structure 624 may extend through at least one layer of the etch-stop material 632 to make electrical connection to one of the capacitor electrodes of the capacitor 628.

In some embodiments, the IC device 602 may be formed in the process 502 as follows.

First, the dielectric material 630 of the bottom metal layer may be deposited over the support structure 622. Deposition of the dielectric material 630 may, e.g., include spin-coating, dip-coating, chemical vapor deposition (CVD), atomic layer deposition (ALD), or any combination of these techniques. The dielectric material 630 may then be patterned to form an opening (e.g., using an etch process, e.g. in combination with using a mask, photolithography or another lithographic technique) into which the electrically conductive material of the bottom portion of the interconnect structure 624 may be deposited, e.g., to form the portion in a first metal layer 634, shown in FIG. 6A. In general, the metal layer 634, as well as other metal layers described with reference to FIGS. 6A-6G may be any suitable interconnect layer, e.g., any of those discussed with reference to the metal layers of FIG. 10.

The electrically conductive material 626 of the interconnect structure 624 may include any of the electrically conductive materials described above with reference to the materials of the S/D contacts 106 (that is why the same pattern is used in FIGS. 6A-6G to illustrate elements of electrically conductive materials as the pattern that was used in FIGS. 1 and 3 to show the S/D contacts 106). In some embodiments, the electrically conductive material 626 of the interconnect structure 624 may be deposited in the process 502 using any suitable processes for providing electrically conductive materials, e.g., ALD, CVD, physical vapor deposition (PVD), or electroplating, e.g., in a damascene or a dual damascene process. In some embodiments, any of the electrically conductive materials deposited in the process 502 and in the subsequent processes may be covered by diffusion barriers or diffusion barrier layers, which may, e.g., include films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like.

The process 502 may further include forming a layer of the etch-stop material 632 over the first metal layer 634 and then depositing the dielectric material 630 of a second metal layer 636. The second portion of the interconnect structure 624 may then be formed by patterning the etch-stop material 632 provided over the first metal layer 634 and by patterning the dielectric material 630 of the second metal layer 636. Next, the capacitor 628 may be formed in the second metal layer 636.

The capacitor 628 will later serve as the capacitor 302 of a memory cell of the IC device shown in FIGS. 6A-6G. In some embodiments, the capacitor 628 formed in the process 502 may be a MIM capacitor, e.g., a capacitor 700 shown in FIG. 7. As shown in FIG. 7, such a capacitor may include a first capacitor electrode 702, a second capacitor electrode 704, and a capacitor insulator material 706 between the two capacitor electrodes 702, 704. In some embodiments, the process 502 may include forming a three dimensional capacitor as illustrated in FIG. 7. To that end, the process 502 may include forming an opening in the dielectric material 630 of the second metal layer 636 (e.g., using an etch process, e.g. in combination with using a mask, photolithography or another lithographic technique), and depositing an electrically conductive material to form the first capacitor electrode 702 of the capacitor 628 so that the first capacitor electrode 702 is in electrical contact with the interconnect structure 624. The process 502 may then include lining the opening with a thin layer of an electrically conductive material to form the first capacitor electrode 702. The process 502 may further include forming a capacitor insulator by depositing the capacitor insulator material 706 over the first capacitor electrode 702, e.g., by depositing a thin layer of an insulator material. An electrically conductive material may then be filled in at least a portion of the remaining opening to form the second capacitor electrode 704. The electrically conductive materials of the first and second capacitor electrodes 702, 704 may include any of the electrically conductive materials described herein, e.g., those listed with reference to the S/D contacts 106. The capacitor insulator material 706 may include any of the insulating/dielectric materials described herein, e.g., those listed with reference to the dielectric material 630. In some embodiments, at least the first capacitor electrode 702 and the capacitor insulator material 706, and, optionally, also the second capacitor electrode 704, may be provided using any suitable conformal deposition technique, such as ALD or CVD. Conformal deposition generally refers to deposition of a certain coating on any exposed surface of a given structure. A conformal coating may, therefore, be understood as a coating that is applied to exposed surfaces of a given structure, and not, for example, just to the horizontal surfaces. In some embodiments, the coating may exhibit a variation in thickness of less than 35%, including all values and ranges from 1% to 35%, such as 10% or less, 15% or less, 20% of less, 25% or less, etc. For instance, the first capacitor electrode 702 can be lined to a thickness of about 20-40 nanometers using a conductive material (e.g., metal, conductive metal nitride or carbide, or the like), followed by a thin dielectric (to increase capacitance, for example, about 3-40 nanometers) that serves as the capacitor insulator material 706, followed by the second capacitor electrode 704, which may have the same or different material composition than the first capacitor electrode 702. In some embodiments, the capacitor 628 may be fabricated in a separate process from the rest of the metal layer fabrication, e.g., to account for its large height and possibly different electrode material from the rest of the metal layer. This may advantageously create a relatively large capacitance in the MIM capacitor by having a relatively large surface area for the terminals (i.e., the first and second capacitor electrodes) separated by a relatively small amount of insulation (i.e., the capacitor dielectric).

Once the capacitor 628 has been formed, the process 502 may include forming a layer of the etch-stop material 632 over the metal layer in which the capacitor 628 has been provided, e.g., over the second metal layer 636, as shown in FIG. 6A.

Figure 6B:
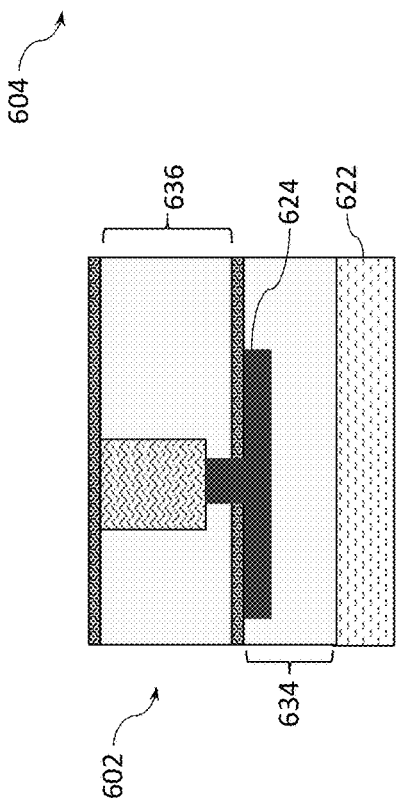

The method 500 may then proceed with a process 504 that includes providing, over the IC device formed in the process 502, a material that may serve as a channel material of the future transistor of the memory cell. An IC device 604, depicted in FIG. 6B, illustrates an example result of the process 504. As shown in FIG. 6B, the IC device 604 may include an intermediate layer 640 provided over the IC device 602 that was formed in the process 502, and then a channel material 642 provided over the intermediate layer 640. In some embodiments, the channel material 642 may include a channel material 102, described with reference to FIG. 1 (that is why the same pattern is used in FIGS. 6B-6G to illustrate the channel material 642 as the pattern that was used in FIGS. 1 and 3 to show the channel material 102).

In some embodiments, the channel material 642 may be provided in the process 504 using a layer transfer technique. In general, layer transfer includes depositing (e.g., using epitaxial deposition/growth) a suitable semiconductor material that will become the channel material 642 on a support structure different from that of the IC device 602, and then transferring a layer of said semiconductor material layer to the IC device 602 using, e.g., oxide-to-oxide (or, more generally, insulator-to-insulator) bonding. In some embodiments, suitable heating and/or pressure may be applied, as known in the art, to bond channel material 642 to the IC device 602. As a result of this bonding, the intermediate layer 640 may be formed which may be a bonding interface.

The intermediate layer 640 may include any material or a combination of materials resulting from bonding of the IC structure formed in the process 502 with the channel material 642 grown on a different support structure (e.g., a different substrate), and then flipped over and bonded to the IC structure formed in the process 502. As such, the intermediate layer 640 may be recognizable as a seam or a thin layer in the IC structure 604, using, e.g., selective area diffraction (SED).

Figure 6C:
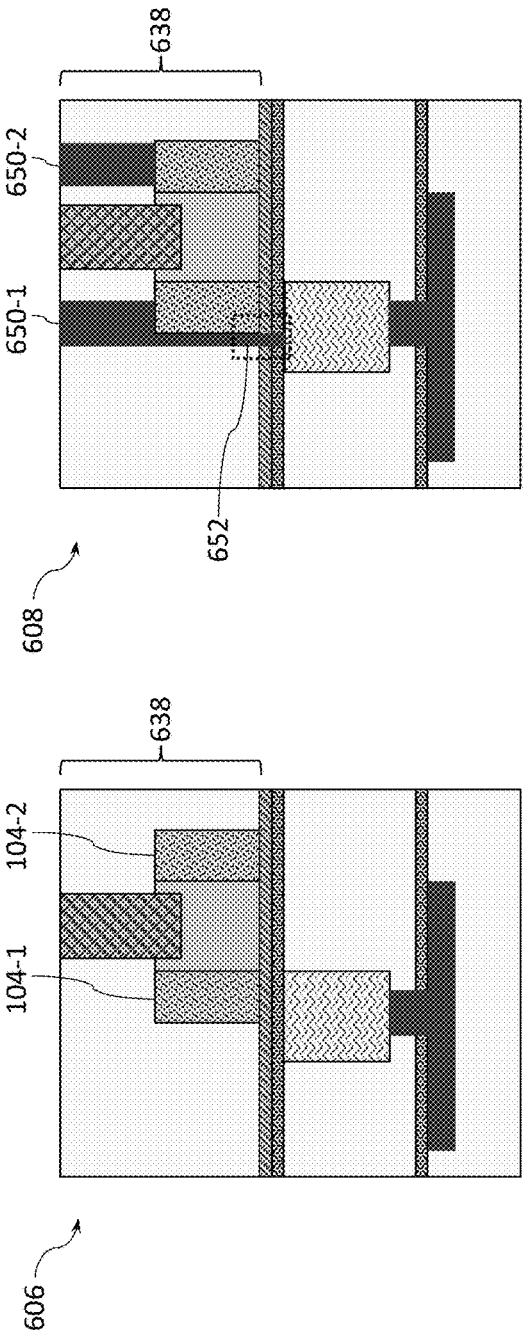

The method 500 may then proceed with a process 506 that includes patterning of the channel material provided in the process 504 to be suitable for a transistor, and forming S/D regions and a gate stack over the patterned channel material. An IC device 606, depicted in FIG. 6C, illustrates an example result of the process 506. As shown in FIG. 6C, the IC device 606 may include patterning the channel material 642 to form a structure with S/D regions 644 and a gate stack 648. The S/D regions 644 may be the S/D regions 104, described with reference to FIG. 1 (that is why the same pattern is used in FIGS. 6C-6G to illustrate the S/D regions 644 as the pattern that was used in FIGS. 1 and 3 to show the S/D regions 104), and the gate stack 648 may be the gate stack 108, described with reference to FIG. 1. As a result of performing the process 506, the first S/D region 104-1 and the second S/D region 104-2, as described with reference to FIG. 1, are formed, the first and second S/D regions 104 labeled in FIG. 6C. FIG. 6C further illustrates that the patterned channel material 642, the S/D regions 644, and the gate stack 648 may be provided in a third metal layer 638 and, as such, may be surrounded by the dielectric material 630, as described above for other metal layers.

Figure 6D:

The method 500 may then proceed with a process 508 that includes forming an electrical contact to one of the S/D regions provided in the process 506 and forming a deep via to provide an electrical contact between the other one of the S/D regions provided in the process 506 and the storage capacitor provided in the process 502. An IC device 608, depicted in FIG. 6D, illustrates an example result of the process 508. As shown in FIG. 6D, the IC device 608 may include forming a deep via 650-1 to provide an electrical contact between the S/D region 104-1 provided in the process 506 and the storage capacitor 628 and forming a via 650-2 to provide an electrical contact to the S/D region 104-2 provided in the process 506. The deep via 650-1 is referred to as "deep" because it should extend all the way through the metal layer 638 and the intermediate materials 640 and 632, so that an electrically conductive material of the deep via 650-1 may make an electrical contact to the capacitor 628, namely, to the second capacitor electrode 704 of the capacitor 628.

In some embodiments, the process 508 may include forming suitable openings and then filling the openings with one or more electrically conductive materials to provide electrically conductive vias 650. In some embodiments, the openings for forming the vias 650 may be formed using any suitable anisotropic etching technique (i.e., etching uniformly in a vertical direction) such as dry etch. In some embodiments, at least the deep via 650-1 may be a high aspect ratio structure in that its' aspect ratio (i.e., height divided by width) may be larger than about 3, e.g., larger than about 10, larger than about 60. The vias 650 may be made electrically conductive by filling the openings with any suitable electrically conductive material, alloy, or a combination of multiple electrically conductive materials, e.g., the electrically conductive material 626, described above. In some embodiments, the vias 650 may be made electrically conductive by only lining the openings in the metal layer 638 with an electrically conductive material, with the center of the lined openings being filled with a suitable insulating material. In such embodiments, the insulating materials may be deposited in the center of the lined openings using spin-coating, dip-coating, CVD, ALD, or any combination of these techniques. In some embodiments, any of the electrically conductive materials 626 deposited in the process 502, e.g., to form the interconnect structure 624, may be covered by diffusion barriers or diffusion barrier layers in the vias 650 to prevent or help preventing the diffusion or migration of the electrically conductive materials from their target locations to the rest of the IC device.

Figure 6G:
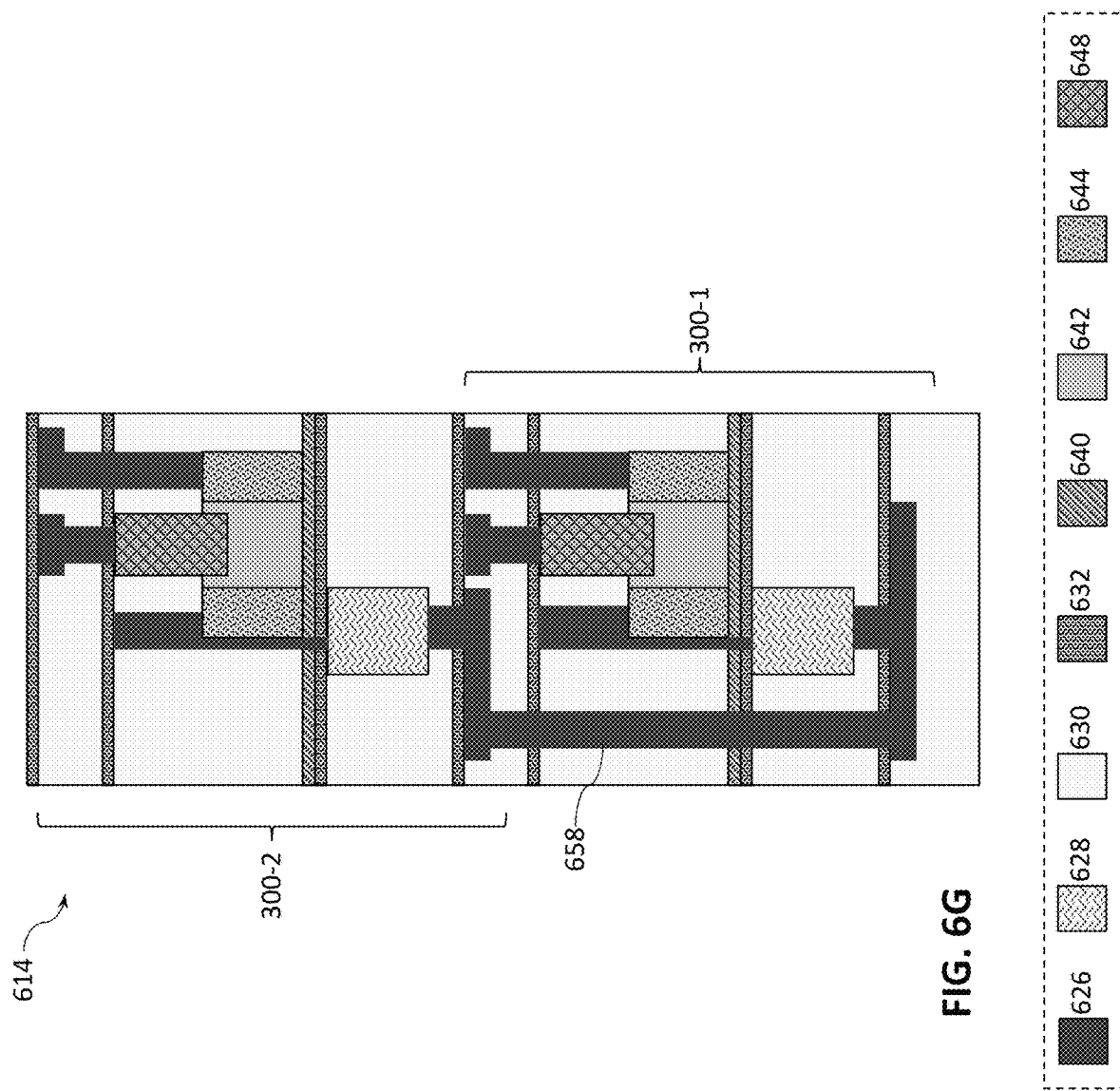

As a result of providing the deep via 650-1, a portion of the deep via 650-1 illustrated in FIG. 6D as a portion 652 (an approximate outline of which is indicated in FIG. 6D with a dotted contour) forms an electrical contact between the S/D region 104-1 and the capacitor 628 (e.g., the second capacitor electrode 704). The remaining portions of the deep via 650-1, e.g., the upper portion above the portion 652, may no longer be needed and, therefore, in an optional process which may be considered to be a part of the process 508, may be removed. A result of this optional process is shown in FIG. 8. FIG. 8 illustrates an IC device 800 which is substantially the same as the IC device 608 of FIG. 6D, except that the deep via 650-1 has been shortened at the upper portion, resulting in a via 850-1 instead, as shown in FIG. 8. The via 850-1 may be formed by removing the upper portion of the via 650-1 and then filling the opening created by removing that portion with a dielectric material, e.g., the dielectric material 630. Although subsequent FIGS. 6E-6G illustrate IC devices formed based on the IC device 608 shown in FIG. 6D, in other embodiments, the IC devices of FIGS. 6E-6G could be formed based on the IC device 800 shown in FIG. 8. Regardless of whether the deep via 650-1 is shortened or not, the portion 652 of the deep via formed in the process 508 provides the back-side contact to the S/D region 104-1, i.e., the portion 652 may be an example of the back-side S/D contact 106-1 shown in FIGS. 1 and 3. On the other hand, the via 650-2 is an example of the front-side S/D contact 106-2 shown in FIGS. 1 and 3.

Next, the method 500 may proceed with a process 510 that includes forming electrical connections to the bottom metal layer, the gate stack, and the front-side S/D contact. An IC device 610, depicted in FIG. 6E, illustrates an example result of the process 510. As shown in FIG. 6E, the IC device 610 may include an additional metal layer 656, which may, optionally, be separated from the previous metal layer 638 by a layer of the etch-stop material 532, with electrical connections 658, 660, and 662 being formed in the process 510 in the metal layer 656 (the connection 658 also extending through other metal layers to make contact to the bottom metal layer). The electrical connections 658, 660, and 662 may be formed using any suitable patterning techniques for forming the openings for these connections, as well as any deposition techniques for making the electrical connections 658, 660, and 662 electrically conductive. Any of the techniques described with reference to the vias 650 and/or the interconnect structure 624 may be used to form the electrical connections 658, 660, and 662 in the process 510.

As shown in FIG. 6E, the electrical connection 658 may be made such as to make electrical contact with the interconnect structure 624. Because the interconnect structure 624 is connected to the first capacitor electrode 702 of the capacitor 628, the electrical connection 658 thus provides an electrical connection to the first capacitor electrode of the capacitor 628. For example, in some embodiments, the electrical connection 658 may be used to connect the first capacitor electrode of the capacitor 628 to a capacitor plate (CP) to which capacitor electrodes of capacitors of other memory cells may also be connected. The electrical connection 660 may be made such as to make electrical contact to the gate stack 648. For example, in some embodiments, the electrical connection 660 may be used to connect the gate stack 648 to a wordline of a memory array. The electrical connection 662 may be made such as to make electrical contact to the front-side S/D contact created by the via 650-2. For example, in some embodiments, the electrical connection 662 may be used to connect the front-side S/D contact created by the via 650-2 to a bitline of a memory array. In this manner, the IC device 610 may be seen as an example of realizing the memory cell 300 shown in FIG. 3 and described above. In some embodiments, the process 510 may also include, optionally, providing another layer of the etch-stop material 632 over the metal layer 656.

In some embodiments, the method 500 may, optionally include processes 512 and 514, shown in FIG. 5. The process 512 may include forming another storage capacitor in the next layer above the support structure, thus starting the process of forming a memory cell similar to that formed using the processes 502-510 but now in a further layer above the support structure 622. An IC device 612, depicted in FIG. 6F, illustrates an example result of the process 512. The IC device 612 illustrates an additional metal layer 666 with another capacitor 628, similar to the metal layer 636 formed in the process 502, and described above. The process 514 of the method 500 may include repeating processes 504-510 to form another memory cell similar to that formed using the processes 502-510. An IC device 614, depicted in FIG. 6G, illustrates an example result of the process 514. The IC device 614 illustrates that, the first memory cell 300 that was formed in the processes 502-510 may be a memory cell 300-1 and that, as a result of the process 514, an analogous memory cell 300-2 may be formed in one or more metal layers above at least some portions of the memory cell 300-1, thus enabling building a stacked, three dimensional memory array. In some embodiments, fabrication of the second layer of devices may need to be compatible with the thermal budget of the first level of devices and interconnects.

The IC device 614 also illustrates that, in some embodiments, the first capacitor electrodes 702 of both of the capacitors 628 may be coupled to one another and to a single interconnect, e.g., to the electrical connection 658, described above. In other embodiments, the first capacitor electrodes 702 of the capacitors 628 may not be coupled to one another and may be coupled to respective different interconnects.

Although not specifically shown in FIG. 5, the method 500 may further include forming one or more first-level interconnects for electrically coupling the IC device formed in the processes 502-514 to one or more further electronic components. Such first-level interconnects may be electrically coupled with the interconnect structures of the IC device resulting from performing the method 500 and configured to route the electrical signals of the memory cells, logic devices, etc., of the IC device to other external devices. For example, the first-level interconnects may be formed to mechanically and/or electrically couple a chip including the IC device resulting from performing the method 500 with another component (e.g., a circuit board). In some embodiments, the first-level interconnects may be solder bumps, solder balls, pins, pillars of electrically conductive material, or any other structures of one or more electrically conductive materials (e.g., metal), for serving as an interface between the IC device resulting from performing the method 500 and one or more further electronic components. Further electronic components may, e.g., include dies with other ICs provided therein, a package substrate, another IC devices or packages, an interposer, a circuit board (e.g., a motherboard), power and signal sources, and so on. In some embodiments, a solder resist material (e.g., polyimide or similar material) may be provided in between one or more of the first-level interconnects.

Variations and Implementations

Various device assemblies illustrated in FIGS. 1-8 do not represent an exhaustive set of IC devices with transistors having one front-side and one back-side S/D contacts as described herein, but merely provide examples of such devices/structures/assemblies. In particular, the number and positions of various elements shown in FIGS. 1-8 is purely illustrative and, in various other embodiments, other numbers of these elements, provided in other locations relative to one another may be used in accordance with the general architecture considerations described herein. For example, in some embodiments, logic devices, e.g., implemented as the transistor 100, may included in any of the IC devices shown in FIGS. 6A-6G, either in the same or separate metal layers from those in which the memory cells are shown.

Further, FIGS. 1-8 are intended to show relative arrangements of the elements therein, and the device assemblies of these figures may include other elements that are not specifically illustrated (e.g., various interfacial layers). Similarly, although particular arrangements of materials are discussed with reference to FIGS. 1-8, intermediate materials may be included in the IC devices and assemblies of these figures. Still further, although some elements of the various cross-sectional views are illustrated in FIGS. 1-8 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of the transistors having one front-side and one back-side S/D contacts as described herein.

Example Electronic Devices

Arrangements with IC devices with transistors having one front-side and one back-side S/D contacts as disclosed herein may be included in any suitable electronic device. FIGS. 9-13 illustrate various examples of devices and components that may include one or more IC devices with transistors having one front-side and one back-side S/D contacts as disclosed herein.

FIGS. 9A-9B are top views of a wafer 2000 and dies 2002 that may include one or more IC devices with transistors having one front-side and one back-side S/D contacts in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 11. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including transistors having one front-side and one back-side S/D contacts as described herein). After the fabrication of the semiconductor product is complete (e.g., after manufacture of transistors having one front-side and one back-side S/D contacts as described herein, e.g. any embodiment of the IC devices shown in FIG. 1, 3, or 6A-6G, described herein), the wafer 2000 may undergo a singulation process in which each of the dies 2002 is separated from one another to provide discrete "chips" of the semiconductor product. In particular, devices that include transistors having one front-side and one back-side S/D contacts as disclosed herein may take the form of the wafer 2000 (e.g., not singulated) or the form of the die 2002 (e.g., singulated). The die 2002 may include one or more transistors and/or supporting circuitry to route electrical signals to the transistors and/or the memory cells (e.g., the memory cells 300 as described herein), as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory cells in a given layer may be formed on a same die 2002 as a processing device (e.g., the processing device 2402 of FIG. 13) or other logic that is configured to store information in the memory devices or execute instructions stored in the memory array.

Figure 10:
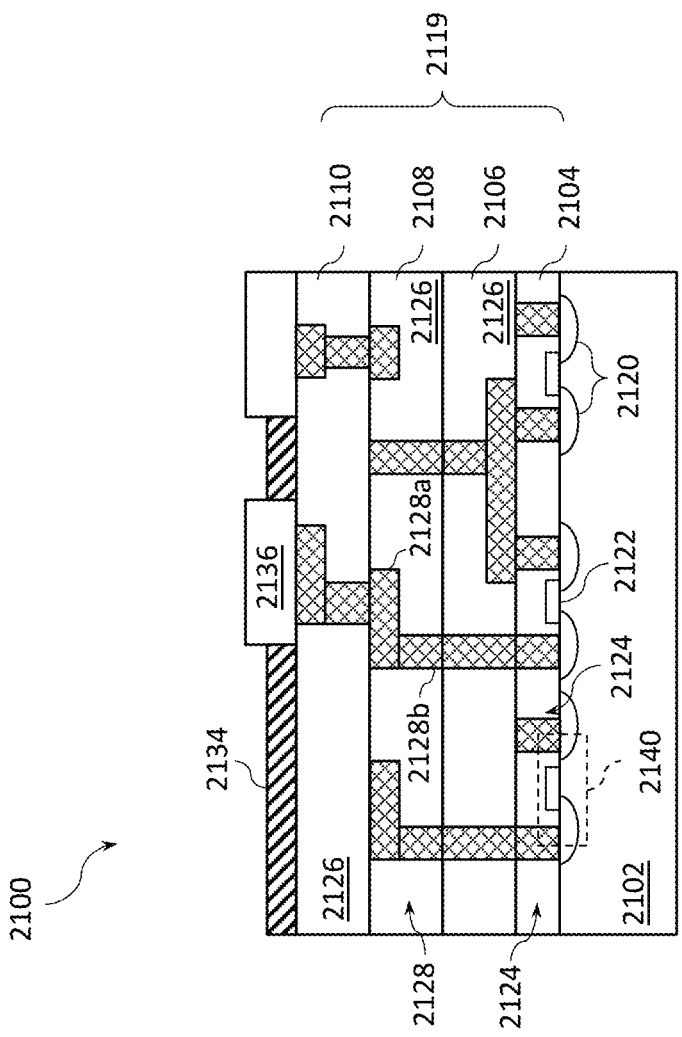
FIG. 10 is a cross-sectional side view of an IC device that may include one or more transistors with back-side contacts in accordance with any of the embodiments disclosed herein.

FIG. 10 is a cross-sectional side view of an IC device 2100 that may include transistors having one front-side and one back-side S/D contacts in accordance with any of the embodiments disclosed herein. For example, the IC device 2100 may be, or may include, any embodiment of the IC devices shown in FIG. 1, 3, or 6A-6G, described herein. In particular, the transistors 100 and/or the memory cells 300 as described herein may be implemented in any of the BEOL layers of the IC device 2100, e.g., in any of the interconnect layers 2106-2110 shown in FIG. 10. Because there are various possibilities where the transistors 100 and the memory cells 300 may be integrated in the IC device 2100, the transistors 100 and the memory cells 300 are not specifically shown in FIG. 10. For example, in some embodiments, at least some of the transistors 100 and/or the memory cells 300 as described herein may be included within one or more of the interconnect layers 2106-2110 of the IC device 2100. In some embodiments, the IC device 2100 may serve as any of the dies 2256 in the IC package 2300.

As shown in FIG. 10, the IC device 2100 may be formed on a substrate 2102 (e.g., the wafer 2000 of FIG. 9A) and may be included in a die (e.g., the die 2002 of FIG. 9B). The substrate 2102 may include any material that may serve as a foundation for an IC device 2100. The substrate 2102 may be a semiconductor substrate, and may include any of the examples described above with reference to the support structure 622. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 9B) or a wafer (e.g., the wafer 2000 of FIG. 9A).

The IC device 2100 may include one or more device layers 2104 disposed on the substrate 2102. The device layer 2104 provides one example of the compute logic layer 410, described above. The device layer 2104 may include features of one or more transistors 2140 (e.g., metal oxide semiconductor field-effect transistors (MOSFETs)) formed on the substrate 2102. The transistors 2140 provide one example of any of the logic devices that may be included in the compute logic layer 410. As shown in FIG. 10, the device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like. In other examples, the device layer 2104 and/or the compute logic layer 410 may include logic devices implemented as the transistor 100, described above.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 112. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 110.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 10 and may include a wide variety of other types and configurations such as, for example, planar transistors, non-planar transistors (e.g., FinFETs, nanowire, or nanoribbon transistors), or a combination of both.

Electrical signals, such as power and/or input/output (I/O) signals, may be routed to and/or from the transistors 2140 of the device layer 2104 through one or more interconnect layers disposed on the device layer 2104 (illustrated in FIG. 10 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 10). Although a particular number of interconnect layers 2106-1210 is depicted in FIG. 10, embodiments of the present disclosure include IC devices having more or fewer interconnect layers than depicted.

In some embodiments, the interconnect structures 2128 may include trench structures 2128a (sometimes referred to as "lines") and/or via structures 2129B (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 10. The via structures 2129B may be arranged to route electrical signals in a direction of a plane that is substantially perpendicular to the surface of the substrate 2102 upon which the device layer 2104 is formed. In some embodiments, the via structures 2129B may electrically couple trench structures 2128a of different interconnect layers 2106-2110 together.

The interconnect layers 2106-2110 may include a dielectric material 2126 disposed between the interconnect structures 2128, as shown in FIG. 10. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 630.

A first interconnect layer 2106 (referred to as Metal 1 or "M1") may be formed directly on the device layer 2104. In some embodiments, the first interconnect layer 2106 may include trench structures 2128a and/or via structures 2129B, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2129B to couple the trench structures 2128a of the second interconnect layer 2108 with the trench structures 2128a of the first interconnect layer 2106. Although the trench structures 2128a and the via structures 2129B are structurally delineated with a line within each interconnect layer (e.g., within the second interconnect layer 2108) for the sake of clarity, the trench structures 2128a and the via structures 2129B may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above. Further metal layers may be present in the IC device 2100, as also described above.

Figure 11:
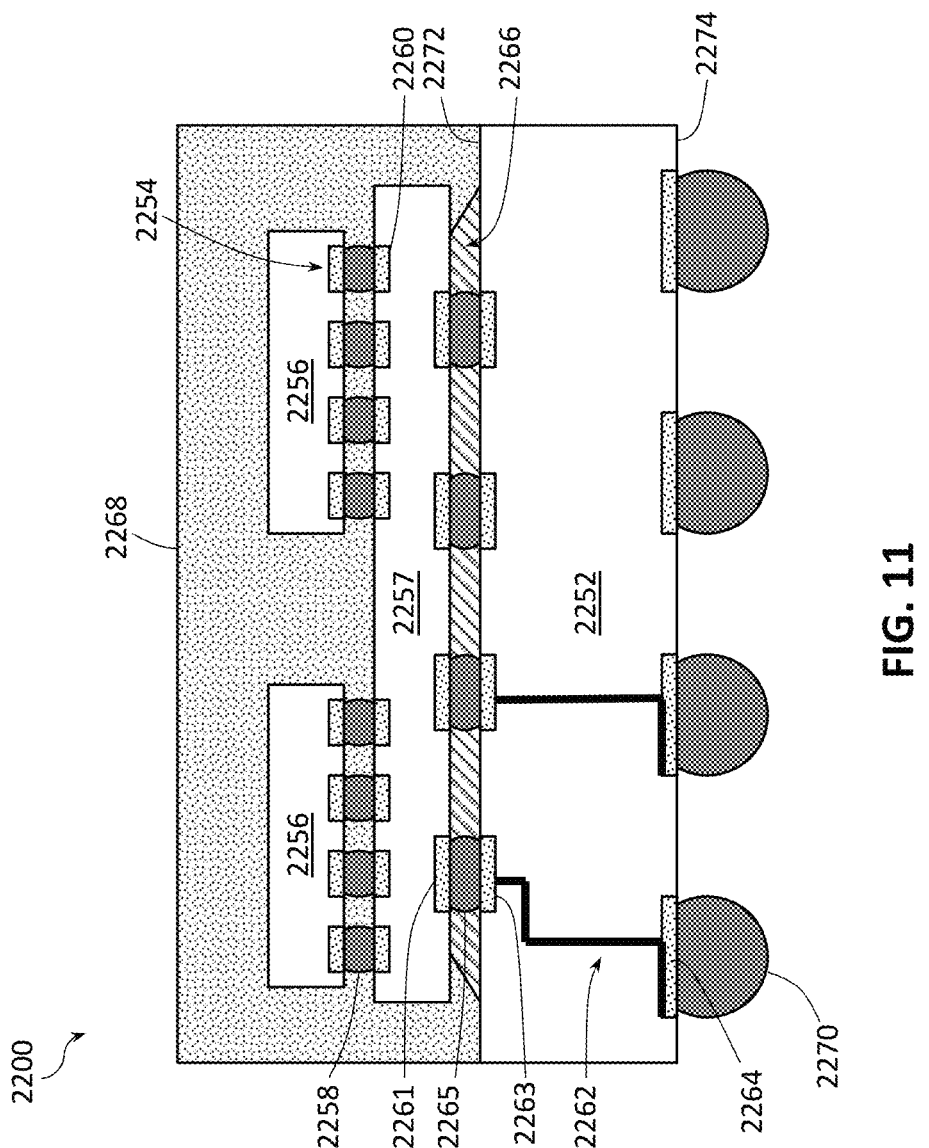
FIG. 11 is a cross-sectional side view of an IC package that may include one or more IC devices with one or more transistors with back-side contacts in accordance with any of the embodiments disclosed herein.

FIG. 11 is a side, cross-sectional view of an example IC package 2200 that may include IC devices with transistors having one front-side and one back-side S/D contacts in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 10.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 11 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded logic and memory devices as described herein. In some embodiments, any of the dies 2256 may include transistors having one front-side and one back-side S/D contacts, e.g., as discussed above; in some embodiments, at least some of the dies 2256 may not include transistors having one front-side and one back-side S/D contacts.

The IC package 2200 illustrated in FIG. 11 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 12:
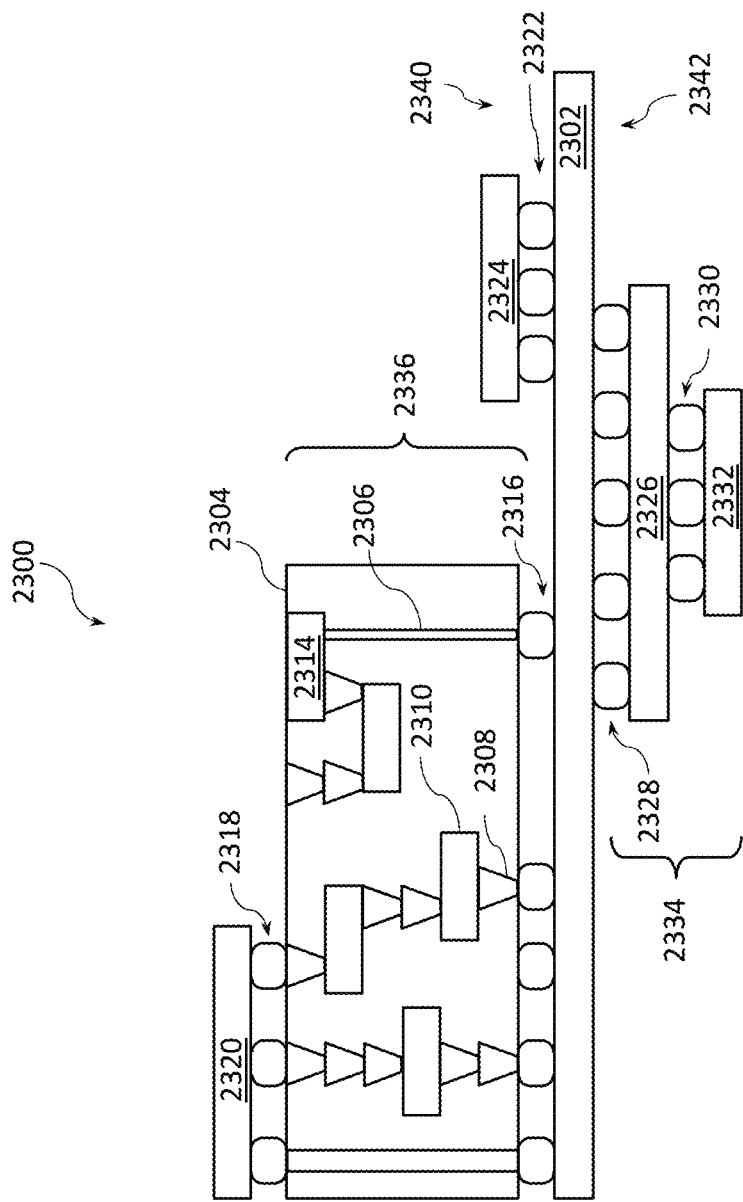
FIG. 12 is a cross-sectional side view of an IC device assembly that may include one or more IC devices with one or more transistors with back-side contacts in accordance with any of the embodiments disclosed herein.

FIG. 12 is a cross-sectional side view of an IC device assembly 2300 that may include components having one or more IC devices with transistors having one front-side and one back-side S/D contacts in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with transistors having one front-side and one back-side S/D contacts in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more IC devices with transistors having one front-side and one back-side S/D contacts provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 9B), an IC device (e.g., the IC device 2100 of FIG. 10), or any other suitable component. In particular, the IC package 2320 may include one or more IC devices with transistors having one front-side and one back-side S/D contacts as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 13:
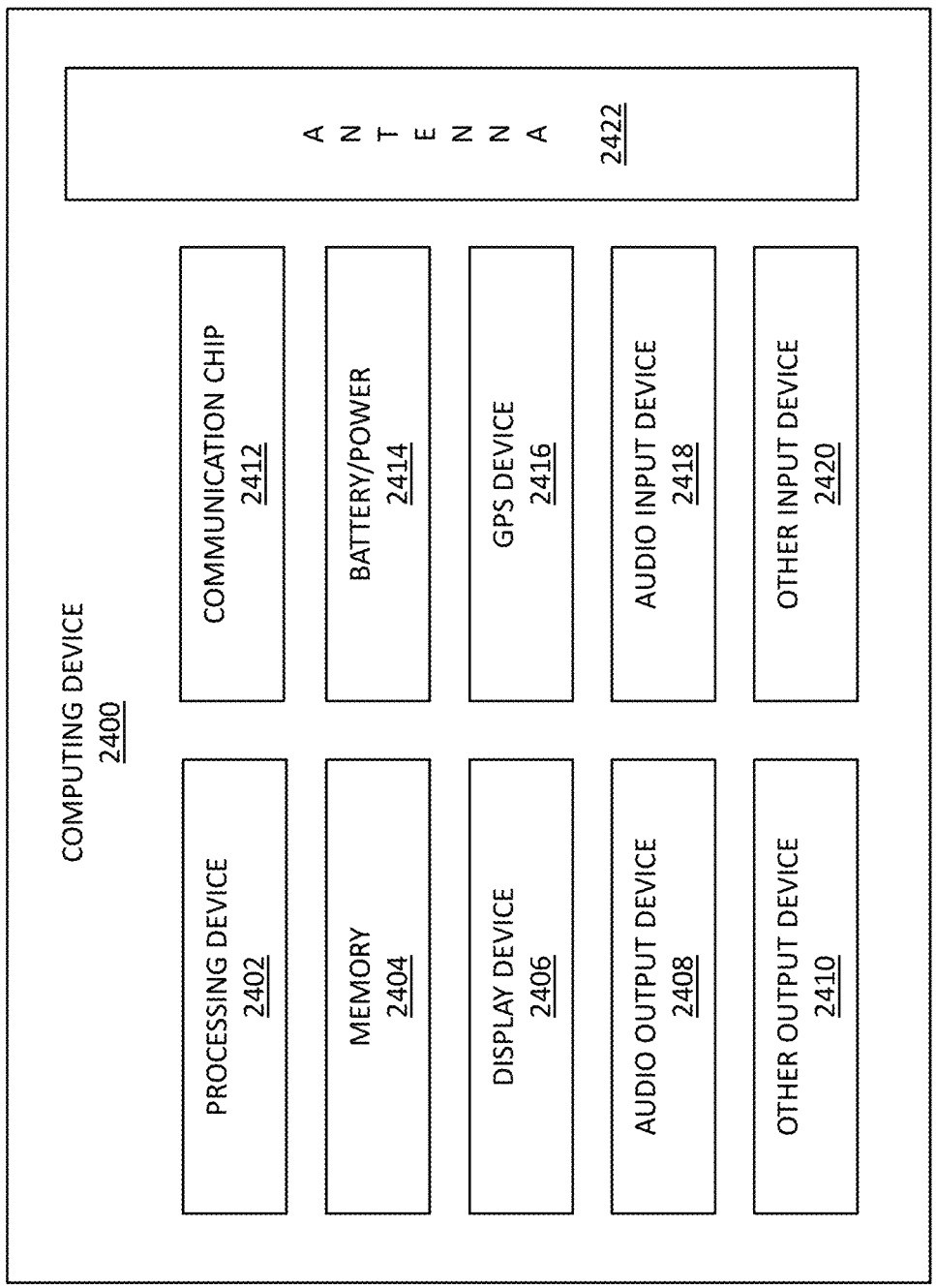
FIG. 13 is a block diagram of an example computing device that may include one or more IC devices with one or more transistors with back-side contacts in accordance with any of the embodiments disclosed herein.

FIG. 13 is a block diagram of an example computing device 2400 that may include one or more components with one or more IC devices with transistors having one front-side and one back-side S/D contacts in accordance with any of the embodiments disclosed herein. For example, any suitable ones of the components of the computing device 2400 may include a die (e.g., the die 2002 (FIG. 9B)) including one or more transistors having one front-side and one back-side S/D contacts in accordance with any of the embodiments disclosed herein. Any of the components of the computing device 2400 may include an IC device 2100 (FIG. 10) and/or an IC package 2200 (FIG. 11). Any of the components of the computing device 2400 may include an IC device assembly 2300 (FIG. 12).

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include one or more IC devices with transistors having one front-side and one back-side S/D contacts as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 602.11 family), IEEE 602.16 standards (e.g., IEEE 602.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes a support structure (e.g., a substrate); a transistor that includes a channel material, a first source or drain (S/D) region, and a second S/D region; a contact (i.e., an electrical contact) to the first S/D region; and a contact to the second S/D region. The contact to the first S/D region is in a first layer over the support structure, the contact to the second S/D region is in a second layer over the support structure, a portion of the channel material between the first S/D region and the second S/D region is in a third layer over the support structure, and the third layer is between the first layer and the second layer.

Example 2 provides the IC device according to example 1, where the transistor further includes a gate stack over at least a portion of the channel material between the first S/D region and the second S/D region, and the IC device further includes a contact to the gate stack.

Example 3 provides the IC device according to example 2, where at least a portion of the contact to the gate stack is in the first layer (i.e., in the same layer as the contact to the first S/D region).

Example 4 provides the IC device according to examples 2 or 4, where the gate stack includes a gate electrode material and a gate dielectric material, where the gate dielectric material is between the gate electrode material and the channel material.

Example 5 provides the IC device according to any one of the preceding examples, where the contact to the second S/D region includes a capacitor. Together, the transistor and the capacitor form a 1T-1C memory cell, where the transistor is an access transistor configured to control access for reading to, or writing from, the memory cell.

Example 6 provides the IC device according to example 5, further including a wordline (WL), coupled to or including the contact to the gate stack and configured to supply a gate signal to the transistor, and a bitline (BL), coupled to or including the contact to the first S/D region and configured to transfer the memory state of the memory cell.

Example 7 provides the IC device according to examples 5 or 6, where the capacitor has a first capacitor electrode, a second capacitor electrode, and an insulator between the first capacitor electrode and the second capacitor electrode, and the contact to the second S/D region further includes a first contact to the first capacitor electrode, and a second contact between the second S/D region and the second capacitor electrode.

Example 8 provides the IC device according to example 7, further including a plateline (PL), coupled to or including the first contact to the first capacitor electrode, and further coupled to a plate voltage generator.

Example 9 provides the IC device according to any one of examples 5-8, where the capacitor is a metal-insulator-metal capacitor.

Example 10 provides the IC device according to any one of examples 1-9, where at least a portion of the channel material is shaped as a fin, i.e., the transistor is a FinFET.

Example 11 provides the IC device according to any one of examples 1-9, where at least a portion of the channel material is shaped as a nanowire, i.e., the transistor is a nanowire transistor.

Example 12 provides the IC device according to any one of examples 1-9, where the transistor is a planar transistor.

Example 13 provides a memory device that includes a memory cell that includes a transistor and a capacitor coupled to a portion of the transistor, where the transistor includes a first S/D region, a second S/D region, and a channel region between the first S/D region and the second S/D region. The memory device further includes a bitline coupled to the first S/D region, the capacitor is coupled to the second S/D region, the channel region is in a layer that is between the bitline and the capacitor.

Example 14 provides the memory device according to example 13, where the transistor further includes a gate stack adjacent to at least a portion of the channel region, and the memory device further includes a wordline coupled to the gate stack.

Example 15 provides the memory device according to examples 13 or 14, where the memory cell is one of a plurality of memory cells of a memory array of the memory device.

Example 16 provides the memory device according to example 15, where the memory device further includes a memory peripheral circuit to control (e.g., access (read/write), store, refresh) the memory array, the memory peripheral circuit provided over a support structure (e.g., a substrate), and at least portions of the plurality of memory cells are provided over the memory peripheral circuit.

Example 17 provides the memory device according to example 16, where at least some of the plurality of memory cells are provided in different layers over the memory peripheral circuit.

In various further examples, the memory device according to any one of the preceding examples is, or is included in, the IC device according to any one of the preceding examples, where the transistor of the memory device is the transistor of the IC device according to any one of the preceding examples and the capacitor of the memory device is the capacitor of the IC device according to any one of the preceding examples.

Example 18 provides a method for fabricating a memory device, the method including forming a capacitor having a first capacitor electrode and a second capacitor electrode; forming an electrical contact to the first capacitor electrode; providing a channel material over the capacitor; patterning the channel material to form a channel region from the channel material, a first S/D region, and a second S/D region, so that at least a portion of the channel region is between the first S/D region and the second S/D region; providing an electrical contact to the first S/D region; and electrically coupling the second capacitor electrode and the second S/D region.

Example 19 provides the method according to example 18, where the capacitor is formed over a support structure (e.g., a substrate), the electrical contact to the first S/D region is provided in a first layer over the support structure, the capacitor is formed in a second layer over the support structure, the channel material is between the first layer and the second layer.

Example 20 provides the method according to example 18 or 19, where the method further includes providing one or more intermediate layers between the capacitor and the channel material, and electrically coupling the second capacitor electrode and the second S/D region includes providing an electrically conductive via through the one or more intermediate layers so that one portion of the electrically conductive via is electrically coupled to the second capacitor electrode and another portion of the electrically conductive via is electrically coupled to the second S/D region.

Example 21 provides an IC package that includes an IC die, including one or more of IC devices according to any one of the preceding examples (e.g., each IC device may be an IC device according to any one of examples 1-12, and/or a memory device according to any one of examples 13-17, and/or may be formed according to a method of any one of examples 18-20). The IC package also includes a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an IC die coupled to the circuit board, where the IC die includes one or more of: one or more IC devices according to any one of the preceding examples (e.g., each IC device may be an IC device according to any one of examples 1-12 and/or may be formed according to a method of any one of examples 18-20), one or more of memory devices according to any one of the preceding examples (e.g., each memory device may be a memory device according to any one of examples 13-17 and/or may be formed according to a method of any one of examples 18-20), and the IC package according to any one of the preceding examples (e.g., the IC package according to any one of examples 21-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a transistor that includes a channel material, a first source or drain (S/D) region, and a second S/D region;
   a contact to the first S/D region; and
   a contact to the second S/D region,
   wherein:
      the contact to the first S/D region is in a first layer,
      the contact to the second S/D region is in a second layer,
      a portion of the channel material between the first S/D region and the second S/D region is in a third layer,
      the third layer is between the first layer and the second layer,
      the contact to the second S/D region includes a capacitor that includes a first capacitor electrode, a second capacitor electrode, and an insulator between the first capacitor electrode and the second capacitor electrode,
      the contact to the second S/D region further includes a first contact to the first capacitor electrode, and a second contact between the second S/D region and the second capacitor electrode, and
      the IC device further includes a plateline, coupled to or including the first contact to the first capacitor electrode, and further coupled to a plate voltage generator.

2. The IC device according to claim 1, further including:
   a wordline, coupled to or including the contact to the gate stack, and
   a bitline, coupled to or including the contact to the first S/D region.

3. The IC device according to claim 1, wherein the capacitor is a metal-insulator-metal capacitor.

4. The IC device according to claim 1, wherein at least a portion of the channel material is shaped as one of a fin, a nanowire, and a nanoribbon.

5. The IC device according to claim 1, wherein the IC device is a memory device.

6. The IC device according to claim 1, wherein:
   the IC device is an IC package that includes an IC die and a further component, the further component coupled to the IC die, and
   the IC die includes the transistor, the contact to the first S/D region, the contact to the second S/D region, and the plateline.

7. The IC device according to claim 1, wherein:
   the transistor further includes a gate stack over at least a portion of the channel material between the first S/D region and the second S/D region, and
   the IC device further includes a contact to the gate stack.

8. The IC device according to claim 7, wherein at least a portion of the contact to the gate stack is in the first layer.

9. The IC device according to claim 7, wherein the gate stack includes a gate electrode material and a gate dielectric material, wherein the gate dielectric material is between the gate electrode material and the channel material.

10. An integrated circuit (IC) device, comprising:
a transistor, comprising a first source or drain (S/D) region and a second S/D region;
a capacitor, comprising a first capacitor electrode and a second capacitor electrode;
a contact to the first capacitor electrode;
a first conductive via structure; and
a second conductive via structure,
wherein:
the first conductive via structure is in conductive contact with the first S/D region,
the second conductive via structure is in conductive contact with the second S/D region, and
the second conductive via structure includes a first portion and a second portion, such that a portion of the second S/D region is between the first portion and the capacitor, and the second portion extends along a side of the second S/D region and is in conductive contact with the second capacitor electrode.

11. The IC device according to claim 10, wherein the second portion is in conductive contact with the side of the second S/D region and is electrically continuous with the first portion.

12. The IC device according to claim 10, wherein a dimension of the second portion in a direction that is substantially parallel to the support structure is smaller than a dimension of the first portion in the direction.

13. The IC device according to claim 10, wherein the contact to the first capacitor electrode is coupled to a plate voltage generator.

14. The IC device according to claim 10, wherein the IC device is a memory device.

15. The IC device according to claim 10, wherein the first portion is in conductive contact with a top of the second S/D region.

16. The IC device according to claim 15, wherein:
the IC device further includes a support structure,
the transistor is over the support structure,
the top of the second S/D region is a first face of the S/D region that is substantially parallel to the support structure and is further away from the support structure than a bottom of the second S/D region,
the bottom of the second S/D region is a second face of the S/D region that is substantially parallel to the support structure, and
the side of the second S/D region is substantially perpendicular to the support structure and extends between the bottom of the second S/D region and the top of the second S/D region.

17. The IC device according to claim 10, wherein:
the IC device is an IC package that includes an IC die and a further component, the further component coupled to the IC die, and
the IC die includes the transistor, the contact to the first S/D region, the contact to the second S/D region, and the plateline.

18. The IC device according to claim 17, wherein the further component is one of a package substrate, a flexible substrate, or an interposer.

19. A method of fabricating an integrated circuit (IC) device, the method comprising:
providing a transistor, comprising a first source or drain (S/D) region and a second S/D region;
providing a capacitor, comprising a first capacitor electrode and a second capacitor electrode;
providing a contact to the first capacitor electrode;
providing a first conductive via structure; and
providing a second conductive via structure,
wherein:
the first conductive via structure is in conductive contact with the first S/D region,
the second conductive via structure is in conductive contact with the second S/D region,
the second conductive via structure includes a first portion and a second portion, such that a portion of the second S/D region is between the first portion and the capacitor, and the second portion extends along a side of the second S/D region and is in conductive contact with the second capacitor electrode,
the second portion is in conductive contact with the side of the second S/D region and is electrically continuous with the first portion, and
the first portion is in conductive contact with a top of the second S/D region.

20. The method according to claim 19, wherein:
the transistor is over the support structure,
a top of the second S/D region is a first face of the S/D region that is substantially parallel to the support structure and is further away from the support structure than a bottom of the second S/D region,
the bottom of the second S/D region is a second face of the S/D region that is substantially parallel to the support structure,
a side of the second S/D region is substantially perpendicular to the support structure and extends between the bottom of the second S/D region and the top of the second S/D region.

* * * * *